(12) United States Patent
Obu et al.

(10) Patent No.: US 9,397,204 B2
(45) Date of Patent: Jul. 19, 2016

(54) HETEROJUNCTION BIPOLAR TRANSISTOR WITH TWO BASE LAYERS

(71) Applicant: MURATA MANUFACTURING CO., LTD., Kyoto-fu (JP)

(72) Inventors: Isao Obu, Kyoto-fu (JP); Yasunari Umemoto, Kyoto-fu (JP); Atsushi Kurokawa, Kyoto-fu (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 14/848,090

(22) Filed: Sep. 8, 2015

(65) Prior Publication Data

US 2016/0005841 A1    Jan. 7, 2016

Related U.S. Application Data

(63) Continuation of application No. PCT/JP2014/054085, filed on Feb. 20, 2014.

(30) Foreign Application Priority Data

Mar. 19, 2013  (JP) ................. 2013-056259

(51) Int. Cl.
*H01L 21/02* (2006.01)
*H01L 29/66* (2006.01)
(Continued)

(52) U.S. Cl.
CPC ........ *H01L 29/7378* (2013.01); *H01L 29/0817* (2013.01); *H01L 29/0821* (2013.01);
(Continued)

(58) Field of Classification Search
USPC ................................. 257/190, 198
See application file for complete search history.

(56) References Cited

U.S. PATENT DOCUMENTS 5,371,389 A    12/1994   Matsuno et al.
6,037,242 A *   3/2000   Hayafuji ................. C30B 1/023
                                                      257/187
(Continued)

FOREIGN PATENT DOCUMENTS

JP    H06-037105 A    2/1994
JP    H06-069220 A    3/1994
(Continued)

OTHER PUBLICATIONS

Oka et al., "Low turn-on voltage GaAs heterojunction bipolar transistors with a pseudomorphic GaAsSb base", Applied Physics Letters, 2001, vol. 78, Abstract Cover Page.
(Continued)

*Primary Examiner* — Marc Armand
*Assistant Examiner* — Wilner Jean Baptiste
(74) *Attorney, Agent, or Firm* — Studebaker & Brackett PC

(57) ABSTRACT

A heterojunction bipolar transistor includes a collector layer composed of a semiconductor containing GaAs as a main component; a base layer including a first base layer and a second base layer the first base layer forming a heterojunction with the collector layer and being composed of a semiconductor containing a material as a main component, the material being lattice-mismatched to the main component of the collector layer, the first base layer having a film thickness less than a critical thickness at which a misfit dislocation is introduced, the second base layer being joined to the first base layer and composed of a semiconductor containing a material as a main component, and the material being lattice-matched to the main component of the collector layer; and an emitter layer that forms a heterojunction with the second base layer.

12 Claims, 40 Drawing Sheets

(51) Int. Cl.
*H01L 29/737* (2006.01)
*H01L 29/10* (2006.01)
*H01L 29/08* (2006.01)
*H01L 29/205* (2006.01)
*H01L 29/417* (2006.01)

(52) U.S. Cl.
CPC .......... *H01L29/1004* (2013.01); *H01L 29/205* (2013.01); *H01L 29/41758* (2013.01); *H01L 29/66318* (2013.01); *H01L 29/7371* (2013.01)

(56) References Cited

U.S. PATENT DOCUMENTS

| | | | |
|---|---|---|---|
| 7,414,261 B2* | 8/2008 | Otsuka | H01L 29/7376 257/26 |
| 2002/0121674 A1 | 9/2002 | Welser et al. | |
| 2002/0163014 A1* | 11/2002 | Welser | H01L 29/1004 257/197 |
| 2003/0025179 A1 | 2/2003 | Pan et al. | |
| 2004/0089875 A1 | 5/2004 | Yagura | |
| 2005/0051799 A1* | 3/2005 | Huang | H01L 29/1004 257/198 |
| 2005/0064672 A1 | 3/2005 | Welser et al. | |
| 2005/0156194 A1* | 7/2005 | Ohbu | H01L 27/0605 257/197 |
| 2005/0158942 A1 | 7/2005 | Welser et al. | |
| 2012/0068207 A1 | 3/2012 | Hata et al. | |

FOREIGN PATENT DOCUMENTS

| | | |
|---|---|---|
| JP | H06-069222 A | 3/1994 |
| JP | 2002-246695 A | 8/2002 |
| JP | 2003-297849 A | 10/2003 |
| TW | 200308088 A | 12/2003 |
| TW | 200416896 A | 9/2004 |
| TW | 201108406 A | 3/2011 |
| WO | 03/009339 A2 | 1/2003 |

OTHER PUBLICATIONS

International Search Report from PCT/JP2014/054085 dated May 27, 2014.
Written Opinion of the International Searching Authority from PCT/JP2014/054085 dated May 27, 2014.

* cited by examiner

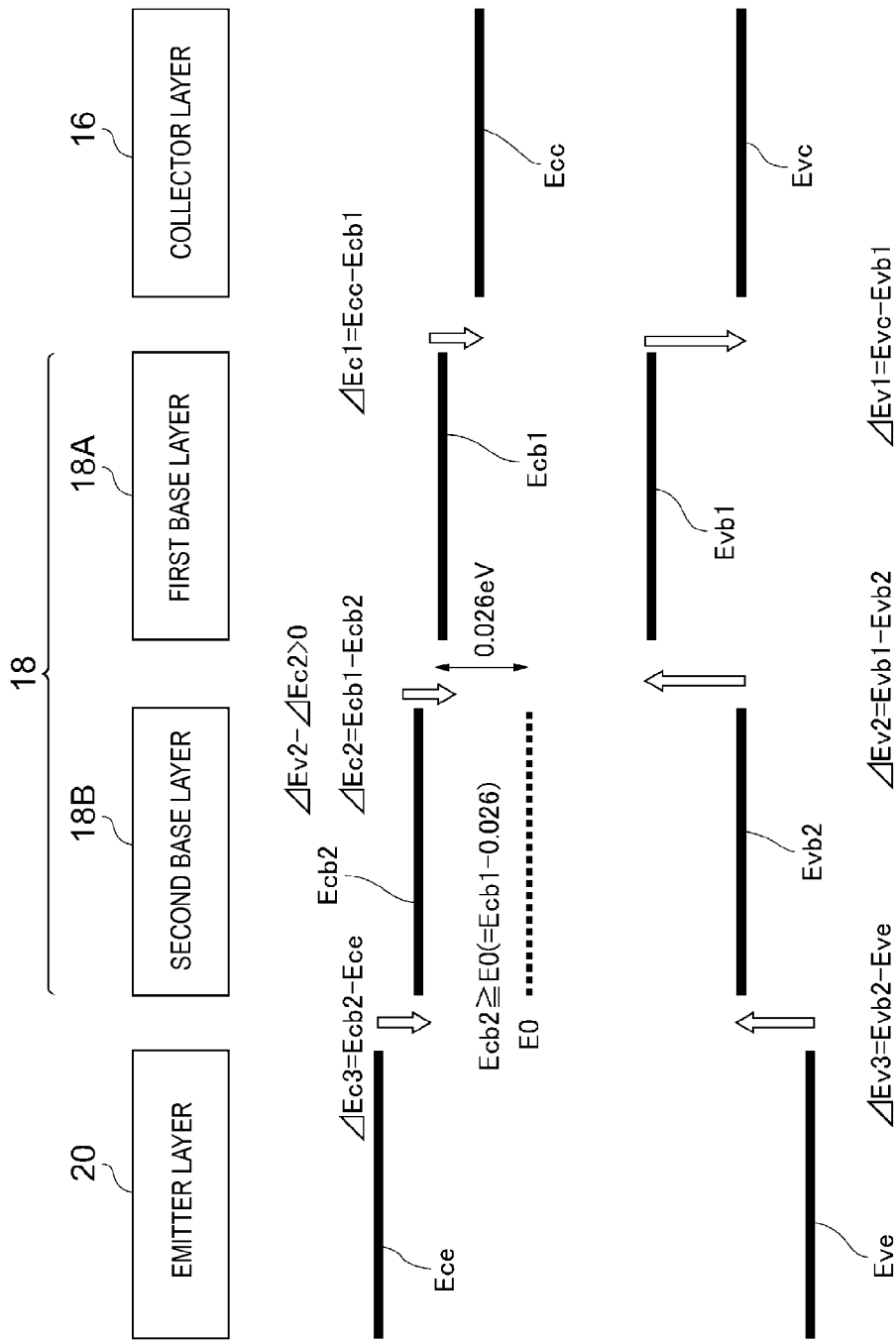

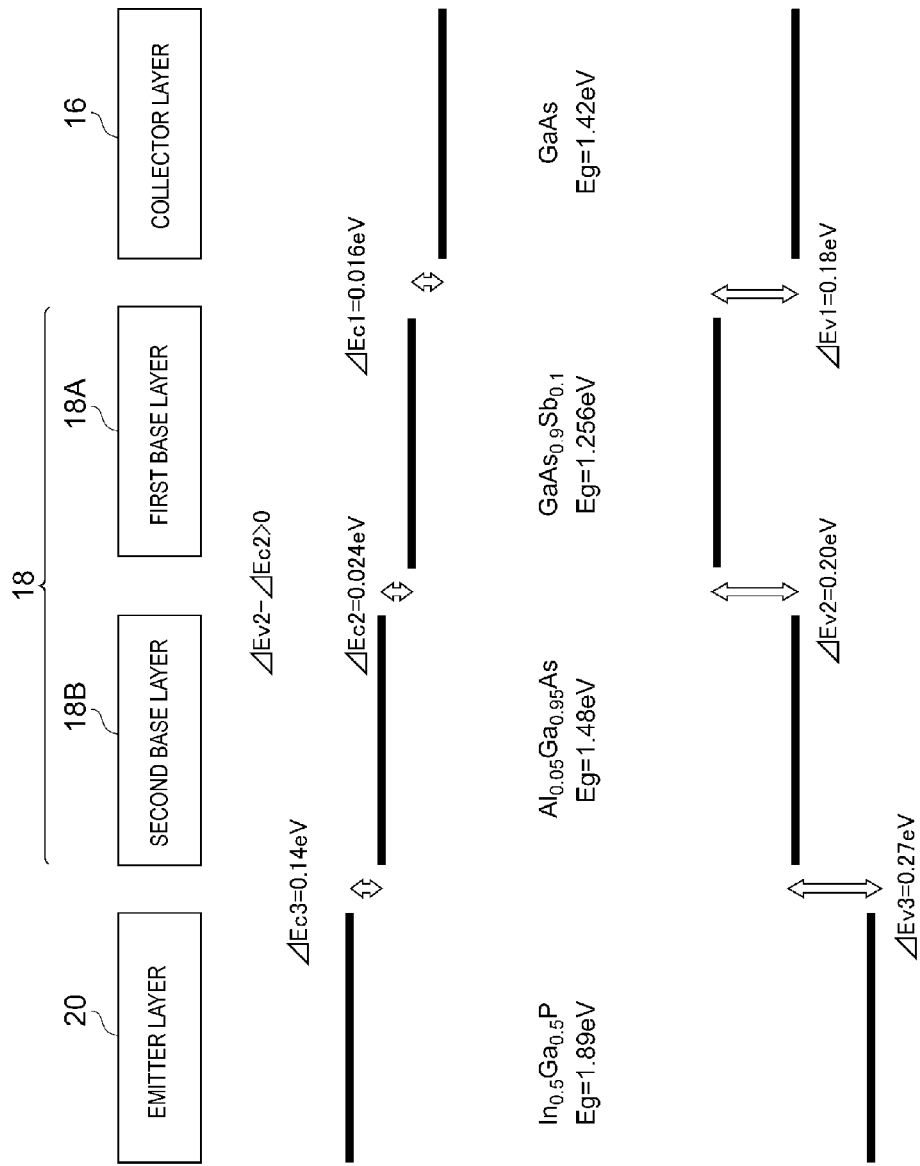

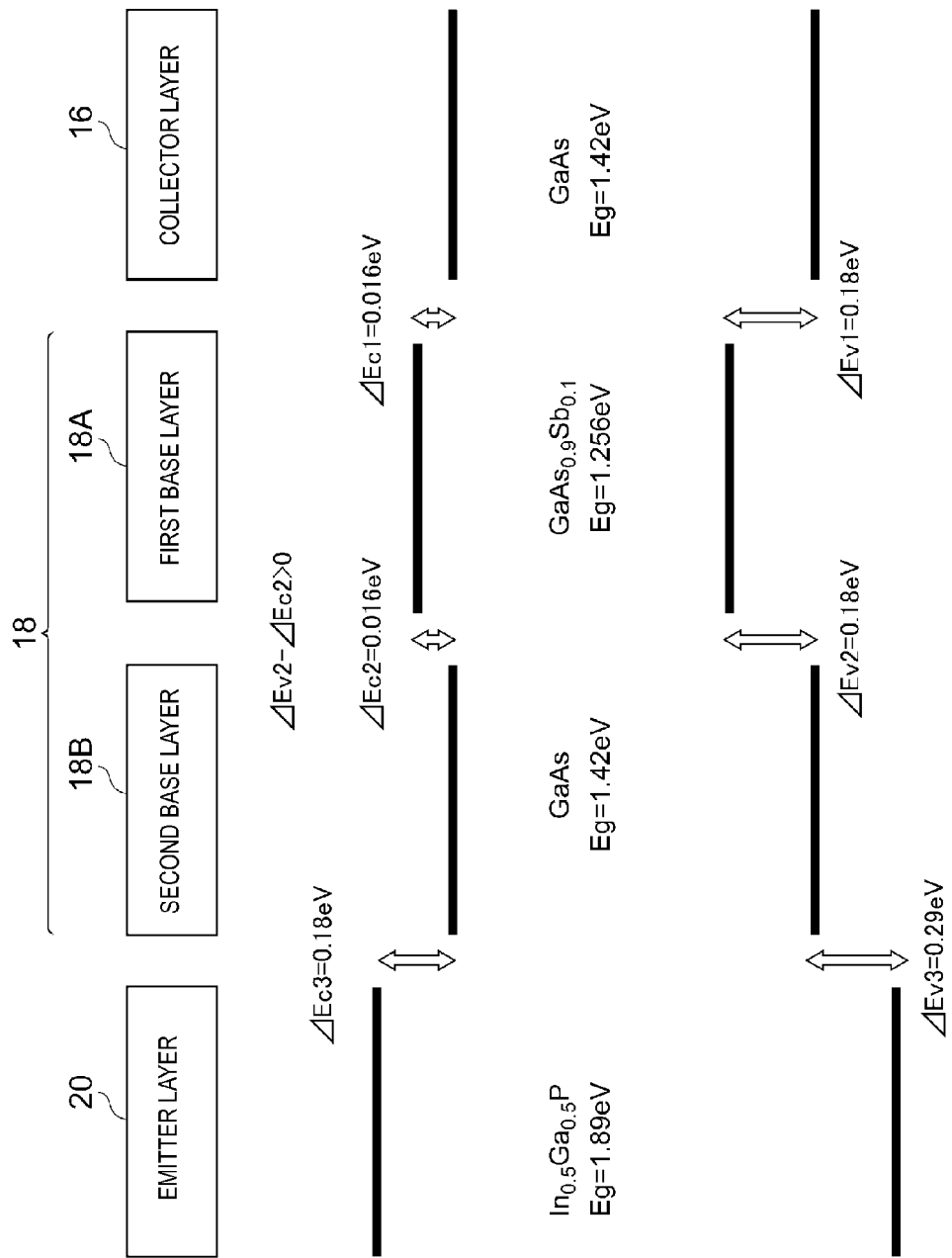

HETEROJUNCTION BIPOLAR TRANSISTOR WITH TWO BASE LAYERS

CROSS-REFERENCE TO RELATED APPLICATION

This application claims benefit of priority to Japanese Patent Application No. 2013-056259 filed Mar. 19, 2013, and International Patent Application No. PCT/JP2014/054085 filed Feb. 20, 2014, the entire content of each of which is incorporated herein by reference.

TECHNICAL FIELD

The present disclosure relates to a heterojunction bipolar transistor.

BACKGROUND

Hitherto, attempts have been made to develop double heterojunction bipolar transistors (hereinafter, referred to as "DHBTs") in order to reduce the offset voltage of transistors.

For example, Japanese Unexamined Patent Application Publication No. 2003-297849 discloses a DHBT that includes a base layer with a two-layer structure including a first base layer composed of GaAsSb that forms a heterojunction with a collector layer composed of InP and a second base layer composed of InGaAs that forms a heterojunction with an emitter layer composed of InP.

SUMMARY

Technical Problem

However, in the DHBT in Japanese Unexamined Patent Application Publication No. 2003-297849, it is disadvantageously difficult to reduce the cost of the DHBT because of the use of expensive InP as a material for the collector layer, compared with GaAs.

If, in the DHBT in Japanese Unexamined Patent Application Publication No. 2003-297849, inexpensive GaAs is used as a material for the collector layer, the first base layer formed on the collector layer is lattice-mismatched to the collector layer because of a difference in material therebetween, thereby straining the crystal of the first base layer. Similarly, the second base layer formed on the collector layer with the first base layer interposed therebetween is lattice-mismatched to the collector layer, thereby also straining the crystal of the second base layer.

In a DHBT used for a power amplifier for mobile communications, it is desirable to increase the film thickness of the base layer in order to reduce the sheet resistance of a base layer from the viewpoint of suppressing high-frequency noise. However, there is a problem in which in the case where the film thickness of the base layer is increased, when each of the first base layer and the second base layer which are lattice-mismatched to the collector layer has a film thickness equal to or larger than a critical thickness, in order to relieve the strain of a crystal in each of the layers, a misfit dislocation is introduced into the crystal to significantly reduce the electrical characteristics and the reliability.

The present disclosure has been accomplished in light of the foregoing circumstances. It is an object of the present disclosure to achieve both of a reduction in cost and the inhibition of reductions in the electrical characteristics and the reliability of a DHBT.

Solution to Problem

A heterojunction bipolar transistor according to an aspect of the present disclosure includes a collector layer composed of a semiconductor containing GaAs as a main component; a first base layer that forms a heterojunction with the collector layer, the first base layer being composed of a semiconductor containing a material as a main component, the material being lattice-mismatched to the main component of the collector layer, and the first base layer having a film thickness less than a critical thickness at which a misfit dislocation is introduced; a second base layer joined to the first base layer, the second base layer being composed of a semiconductor containing a material as a main component, the material being lattice-matched to the main component of the collector layer; and an emitter layer that forms a heterojunction with the second base layer.

Advantageous Effects of Disclosure

In the DHBT according to the present disclosure, both of a reduction in cost and the inhibition of reductions in the electrical characteristics and reliability are achieved.

BRIEF DESCRIPTION OF THE DRAWINGS

FIG. 7 is a schematic diagram of energy band structures of a collector layer, a first base layer, a second base layer, and an emitter layer of the DHBT according to the first embodiment in a thermal equilibrium state before the layers are joined together.

FIG. 9 is a schematic diagram of energy band structures of a collector layer, a first base layer, a second base layer, and an emitter layer of the DHBT according to a third embodiment in a thermal equilibrium state before the layers are joined together.

FIG. 11 is a schematic diagram of energy band structures of a collector layer, a first base layer, a second base layer, and an emitter layer of the DHBT according to a second embodiment in a thermal equilibrium state before the layers are joined together.

DETAILED DESCRIPTION

Description of Embodiments

Figure 1:
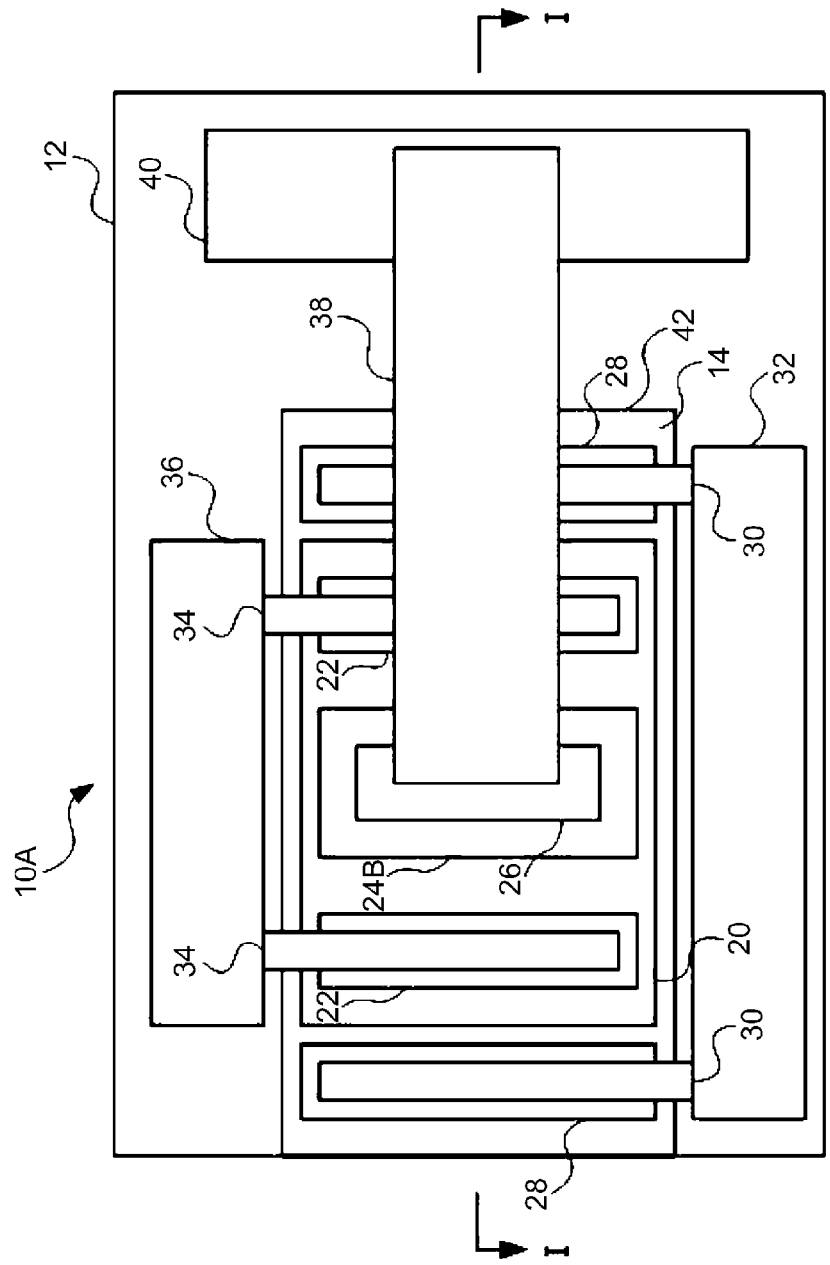
FIG. 1 is a plan view of a DHBT according to a first embodiment.

Embodiments of the present disclosure will be described below with reference to the drawings. The embodiments described below are merely illustrative and are not intended to exclude various modifications and techniques which are not described below. That is, various changes (for example, combinations of the embodiments) can be made without departing from the scope of the disclosure. In the drawings, the same or similar portions are designated using the same or similar reference numerals. The drawings are schematic drawings, and the dimensions and ratios in the drawings are not always the same as those of the actual objects. Some drawings may include portions which differ from one drawing to another in dimensional relationship and ratio.

First Embodiment

A double heterojunction bipolar transistor (DHBT) according to a first embodiment of the present disclosure mainly includes a collector layer, a base layer, an emitter layer on a substrate, the collector layer forming a heterojunction with the base layer, and the base layer forming a heterojunction with the emitter layer. In the DHBT, the offset voltage is reduced, compared with a single heterojunction bipolar transistor (hereinafter, referred to as an "SHBT").

Structure

Figure 2:
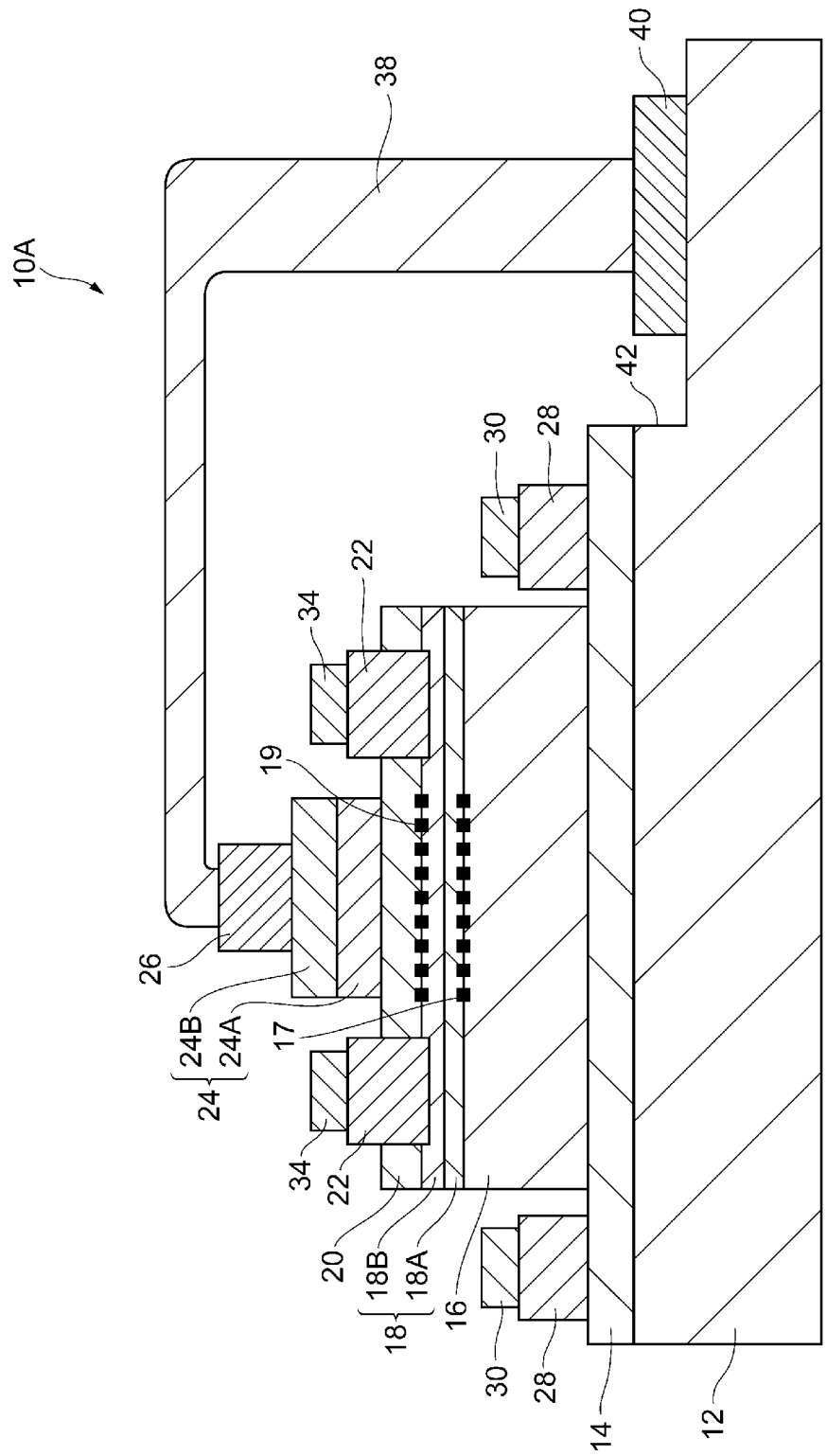
FIG. 2 is a cross-sectional view taken along line I-I in FIG. 1.

The structure of the DHBT according to the first embodiment will be described. FIG. 1 is a plan view of a DHBT 10A according to the first embodiment. FIG. 2 is a cross-sectional view taken along line I-I in FIG. 1.

As illustrated in FIGS. 1 and 2, in the DHBT 10A according to the first embodiment, a subcollector layer 14 is arranged on a substrate 12. A collector layer 16, a base layer including a first base layer 18A with a single-layer structure and a second base layer 18B with a single-layer structure, and an emitter layer 20 are arranged on the subcollector layer 14. The collector layer 16 forms a heterojunction 17 with the first base layer 18A. The second base layer 18B forms a heterojunction 19 with the emitter layer 20. Base electrodes 22 are arranged through the emitter layer 20. A contact layer 24 with, for example, a two-layer structure is arranged on the emitter layer 20.

An emitter electrode 26 is arranged on the contact layer 24. Collector electrodes 28 are arranged on the subcollector layer 14. The collector electrodes 28 are connected to a metal pad 32 through collector lines 30 (see FIG. 1). The base electrodes 22 are connected to a metal pad 36 through base lines 34 (see FIG. 1). The emitter electrode 26 is connected to a metal pad 40 through an emitter line 38. An isolation trench 42 is provided between the metal pad 40 and a corresponding one of the collector electrodes 28. The metal pads 32, 36, and 40 are used for electrical connection to the outside of the DHBT 10A.

The structure of the DHBT 10A described above is illustrative and is not limited thereto.

For example, in the DHBT 10A, in the case where the substrate 12 and the subcollector layer 14 are composed of different materials, a buffer layer with a single- or multi-layer structure may be arranged between the substrate 12 and the subcollector layer 14 as described below. For example, as a DHBT 10B illustrated in FIG. 3, a buffer layer 50 having a three-layer structure including a first buffer layer 50A, a second buffer layer 50B, and a third buffer layer 50C, in that order, from the substrate 12 side may be arranged between the substrate 12 and the subcollector layer 14.

Figure 4:
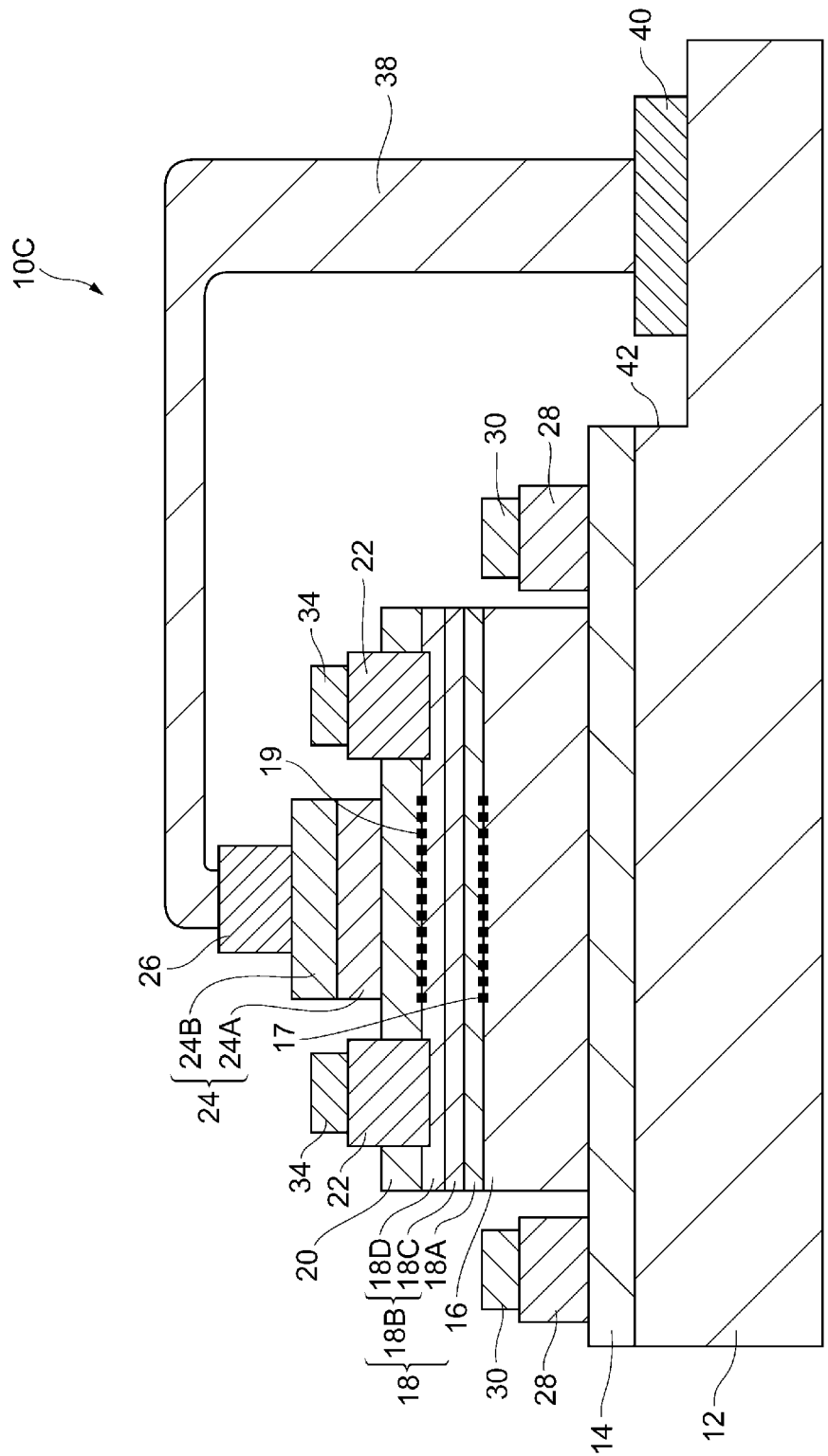
FIG. 4 illustrates another modified embodiment of the DHBT illustrated in FIG. 2.

Each of the first base layer 18A and the second base layer 18B may not have a single-layer structure. At least one of them may have a multi-layer structure. For example, as a DHBT 10C illustrated in FIG. 4, the second base layer 18B may have a two-layer structure including a first layer 18C and a second layer 18D, in that order, from the collector layer 16 side.

Furthermore, what is called a ballast resistor layer, not illustrated, having a single- or multi-layer structure may be arranged between the emitter layer 20 and the contact layer 24.

Description of Component

Materials, band structures, and so forth of components of the DHBT 10A having the foregoing structure will be described below.

The substrate 12 preferably contains, but is not particularly limited to, a semi-insulating material or semiconductor material as a main component. Examples of the semi-insulating material include GaAs, InP, SiC, and GaN. An example of the semiconductor material is Si. Of these, the substrate 12 preferably contains GaAs or Si because GaAs or Si is inexpensive and a large-size substrate composed of GaAs or Si is easily produced, compared with InP and so forth. The substrate 12 more preferably contains Si because Si is inexpensive and a large-size substrate composed of Si is easily produced, compared with GaAs. Note that "main component" indicates that a material serving as a main component accounts for 80% by mass or more of the entirety of a substrate or layer. Thus, the substrate 12 may contain an impurity in an amount of less than 20% by mass, in addition to the main component. However, from the viewpoint of maintaining the semi-insulating characteristics and reducing the cost, the substrate 12 preferably has a lower impurity content.

Figure 3:
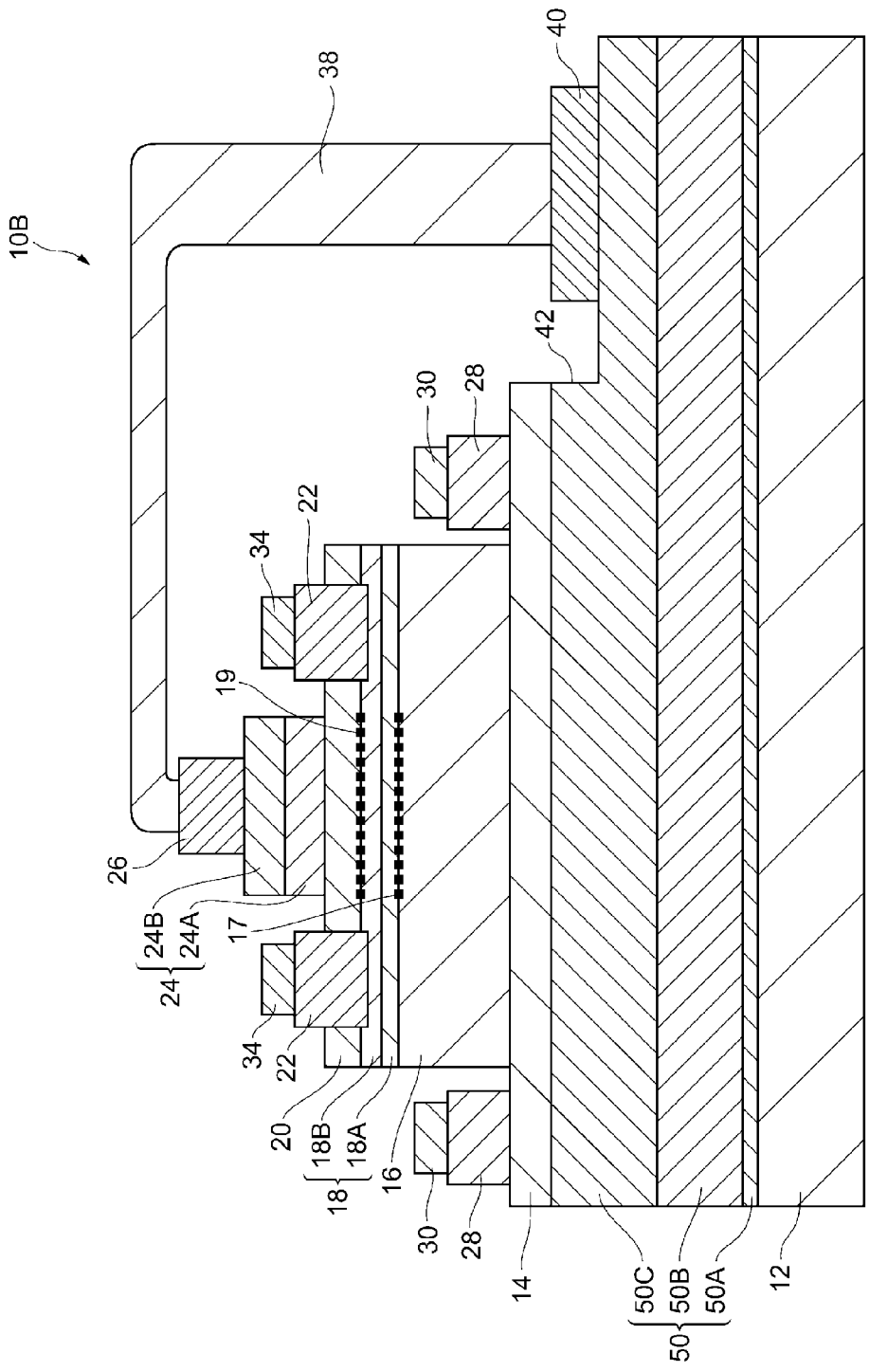
FIG. 3 illustrates a modified embodiment of the DHBT illustrated in FIG. 2.

If Si is used as a material for the substrate 12, the material of the substrate 12 is different from the material (GaAs) of the collector layer 16 described below. Furthermore, the lattice constant of the substrate 12 differs from that of the collector layer 16. Thus, for example, as illustrated in FIG. 3, the first buffer layer 50A (with a film thickness of, for example, 20 nm), the second buffer layer 50B (with a film thickness of, for example, 0.7 µm), and the third buffer layer 50C (with a film thickness of, for example, 1 µm) which are composed of undoped GaAs are preferably arranged between the substrate 12 and the collector layer 16.

A material for the subcollector layer 14 is, but not particularly limited to, for example, n-type GaAs (Si concentration: $5 \times 10^{18}$ cm$^{-3}$). The film thickness of the subcollector layer 14 is, but not particularly limited to, for example, 0.6 µm.

The collector layer 16 is composed of a semiconductor mainly containing GaAs, which is inexpensive and thus enables cost reduction, compared with InP that has been used as a material for the collector layer 16. The semiconductor of the collector layer 16 may contain an impurity (including a dopant described below) in an amount of less than 20% by mass in addition to GaAs. The composition ratio of GaAs may not be perfectly 1:1 and may be deviated by about 0.01 from 1:1.

Regarding a material used as a main component of a collector layer in the related art, ordered InGaP is used in addition to InP. However, with respect to the ordered InGaP, the epitaxial growth needs to be controlled within a specific crystal growth temperature range in order to achieve ordering. An advanced control technique is needed, so it is difficult to reduce costs from an industrial point of view.

In contrast, the collector layer 16 is composed of the semiconductor mainly containing GaAs. There is no need for an advanced control technique during epitaxial growth, unlike the case where InGaP is a main component. It is thus possible to reduce costs, compared with InGaP.

Furthermore, the following effect is also provided: GaAs serving as the main component of the collector layer 16 has a higher thermal conductivity than that of ordered InGaP that has been used. Thus, heat dissipation performance is improved on the side of the collector layer 16, thereby improving transistor characteristics in high-temperature operation or high-power operation.

The GaAs-containing collector layer 16 as a whole may be an n-type semiconductor or p-type semiconductor. In the case where the collector layer 16 is composed of an n-type semiconductor, the DHBT 10A acts as an npn junction transistor. In the case where the collector layer 16 is composed of a p-type semiconductor, the DHBT 10A acts as a pnp junction transistor. The hole mobility of GaAs is significantly lower than the electron mobility (electron mobility: about 0.85 m$^2$/(Vs), hole mobility: about 0.04 m$^2$/(Vs)). Thus, the collector layer 16 is preferably composed of an n-type semiconductor because good frequency characteristics are provided, compared with the case of a pnp junction. To produce the n-type collector layer 16, the collector layer 16 is doped with a dopant, for example, Si, S, Se, Te, or Sn. To produce the p-type collector layer 16, the collector layer 16 is doped with a dopant, for example, C, Mg, Be, Zn, or Cd.

The type of the heterojunction 17 formed between the collector layer 16 and the first base layer 18A may be any of what is called "type I", "type II", and "type III". The type of junction may be determined by a capacitance-voltage (C-V) method or a photoluminescence (PL) method. The type of junction is preferably what is called "type II" from the viewpoint of suppressing the energy barrier to electrons between the collector layer 16 and the first base layer 18A (for example, see energy Ec of the bottom of the conduction band in FIG. 8A). The type of the heterojunction 19 formed between the emitter layer 20 and the second base layer 18B may be any of what is called "type I", "type II", and "type III". The type of junction is preferably what is called "type I" from the viewpoint of achieving high-speed electron transport (for example, see energy Ec of the bottom of the conduction band in FIG. 8A).

In the case where the DHBT 10A is used in, for example, a power amplifier for mobile communications, the base layer 18 preferably has a sheet resistance of 200 Ω/square or less from the viewpoint of suppressing high-frequency noise. To obtain a sheet resistance of 200 Ω/square or less, the thickness of the base layer 18 may be increased to a thickness such that the sheet resistance is 200 Ω/square or less.

The first base layer 18A of the base layer 18 is composed of a semiconductor mainly containing a material that is lattice-mismatched to the main component (GaAs) of the collector layer 16. The term "lattice matching" used in this embodiment includes both of the cases where two materials have an identical lattice constant and the case where a difference in lattice constant between two materials is within ±0.13%, which can cause a negligible strain. That is, regarding the semiconductor of the base layer 18, a material having a lattice constant (less than 5.645 Å or more than 5.660 Å) outside the range within ±0.13% of a lattice constant of GaAs of about 5.653 Å is used as a main component of the first base layer 18A on the basis of the foregoing definition of "lattice matching".

Figure 5:
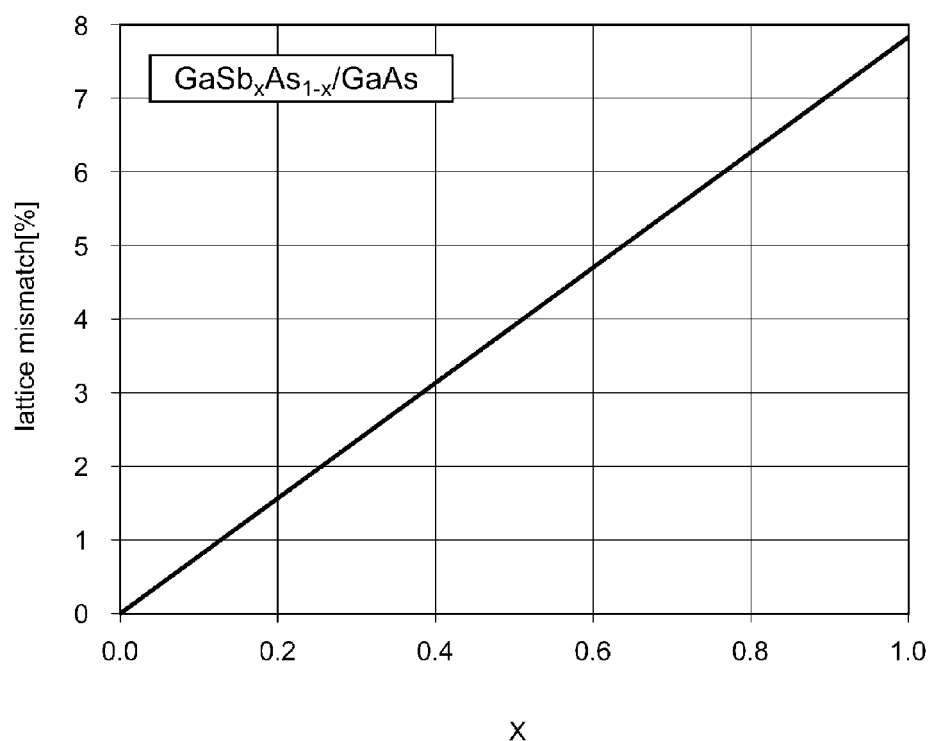
FIG. 5 is a graph of the dependence of a difference (%) in lattice constant between $GaSb_xAs_{1-x}$ and GaAs on the composition ratio of Sb, the horizontal axis representing the composition ratio x of Sb, and the vertical axis representing the difference (%) in lattice constant.

An example of the main component that satisfies the foregoing conditions is, but not particularly limited to, $GaSb_xAs_{1-x}$ (x denotes the composition ratio of Sb, and x>0). In the case where the main component is $GaSb_xAs_{1-x}$, the difference in lattice constant with respect to GaAs is more than +0.13%, except for the case of a very small composition ratio x of Sb (for example, the case where x is 0.01 or less), as illustrated in FIG. 5.

The film thickness of the first base layer 18A is less than a critical thickness at which a misfit dislocation is introduced into the crystal of the first base layer 18A, in particular, the interface between the first base layer 18A and the collector layer 16.

Figure 6:
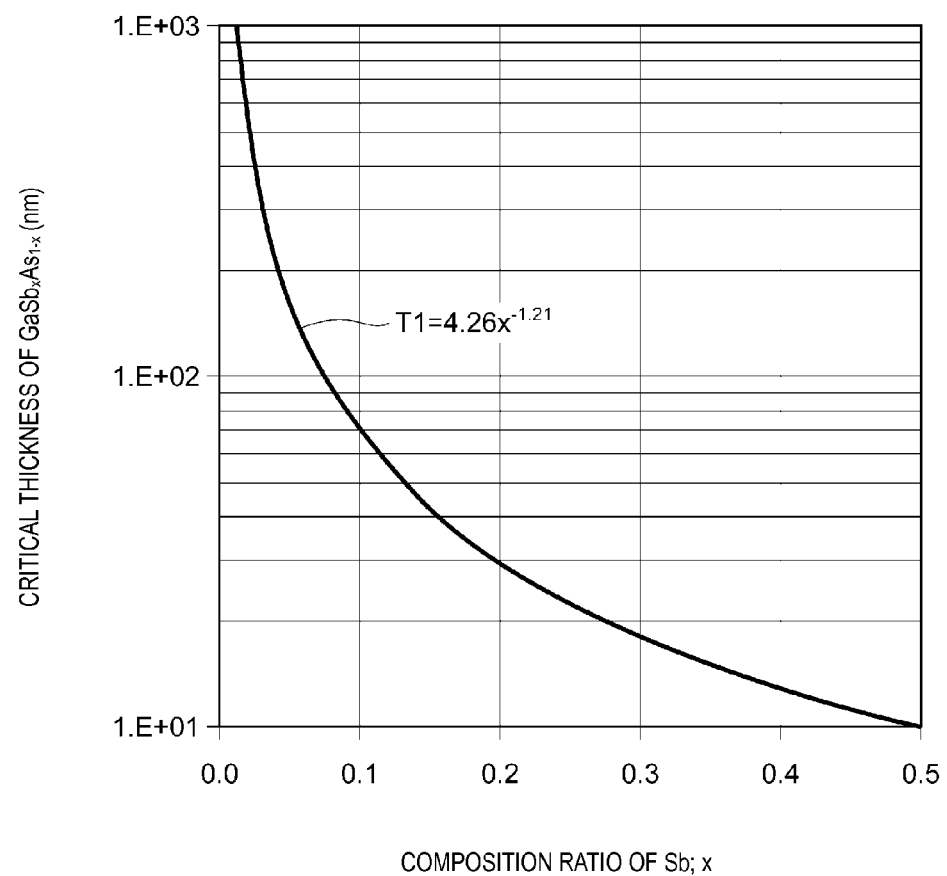
FIG. 6 is a graph of the dependence of the critical thickness of $GaSb_xAs_{1-x}$ on the composition ratio of Sb, the horizontal axis representing the composition ratio x of Sb, and the vertical axis representing the critical thickness (nm).

For example, in the case where the main component of the first base layer 18A is $GaSb_xAs_{1-x}$, the critical thickness T1 is expressed as: $T1=4.26x^{-1.21}$ (nm), as illustrated in FIG. 6. Thus, in this case, the film thickness of the first base layer 18A is less than $T1=4.26x^{-1.21}$ (nm).

In this embodiment, the film thickness of the first base layer 18A is less than the critical thickness T1 as described above. Thus, a misfit dislocation is not introduced into the crystal of the first base layer 18A.

To ensure the film thickness of the base layer 18 such that the sheet resistance is 200 Ω/square or less as described above, the film thickness needs to be a film thickness equal to or larger than the critical thickness T1 of the first base layer 18A, in some cases. For example, as a reference example, in the case where the base layer of the DHBT is formed of a $GaSb_{0.1}As_{0.9}$ layer (C concentration: $4×10^{19}$ cm$^{-3}$) alone, a film thickness of 140 nm or more is required to achieve a sheet resistance of 200 Ω/square or less. However, in the reference example, a difference in lattice constant between the collector layer composed of GaAs and the base layer composed of $GaSb_{0.1}As_{0.9}$ is about 1%. Thus, in the case of the base layer having a film thickness more than 70 nm, a misfit dislocation is introduced into the crystal, thereby significantly degrading the electrical characteristics and the reliability.

In contrast, in the DHBT 10A according to the embodiment, the first base layer 18A has a film thickness less than the critical thickness T1, thereby inhibiting (avoiding) the introduction of a misfit dislocation to inhibit the degradation of the electrical characteristics and the reliability. Thus, in the DHBT 10A according to the embodiment, both of the reduction in cost and the inhibition of reductions in the electrical characteristics and the reliability are achieved.

The film thickness of the base layer 18 such that the sheet resistance is 200 Ω/square or less is ensured by allowing the film thickness of the first base layer 18A to be less than the critical thickness T1 and increasing the film thickness of the second base layer 18B described below. Thus, in the DHBT 10A according to the embodiment, the introduction of a misfit dislocation is inhibited, and a sheet resistance of 200 Ω/square or less is provided.

The second base layer 18B of the base layer 18 is joined to the first base layer 18A and mainly contains a material that is lattice-matched to the main component (GaAs) of the collector layer 16, in contrast to the first base layer 18A. That is, a material having a lattice constant (5.645 Å or more and 5.660 Å or less) within ±0.13% of a lattice constant of GaAs of about 5.653 Å is used as a main component of the second base layer 18B on the basis of the foregoing definition of "lattice matching".

Examples of the main component that satisfies the foregoing conditions include, but are not particularly limited to, GaAs the same as the main component of the collector layer 16 and $Al_yGa_{1-y}As$ having a lattice constant of about 5.653 Å or more and less than 5.660 Å (where y denotes the composition ratio of Al, and y>0). The main component of the second base layer 18B is preferably a material of a binary mixed crystal (for example, GaAs) rather than a material of a ternary mixed crystal (for example, AlGaAs) from the viewpoint of improving variations in turn-on voltage to increase the yield. The reason for this is that the turn-on voltage of the DHBT 10A is determined by the band-gap energy of the second base layer 18B in contact with the emitter layer 20. More specifically, in the case where the main component is a material of a ternary mixed crystal, such as AlGaAs, the band-gap energy varies depending on the concentration ratio of Al to Ga, which are group III elements. The variations in band-gap energy depend on the controllability of an epitaxial growth technique. In the case where the main component is a material of a binary mixed crystal, such as GaAs, Ga alone is a group III element. In this case, there is basically no variations in band-gap energy.

In the DHBT in Japanese Unexamined Patent Application Publication No. 2003-297849, InP having a lattice constant of about 5.869 Å is used as a material for the collector layer. The first base layer composed of $GaSb_{0.6}As_{0.4}$ having a lattice constant of about 5.9189 Å is used.

However, InP is more expensive than GaAs used as a material for the collector layer, thus disadvantageously causing difficulty in reducing the cost of the DHBT.

If GaAs, which is inexpensive, is used as a material for the collector layer of the DHBT in Japanese Unexamined Patent Application Publication No. 2003-297849, a difference in lattice constant between the collector layer and the first base layer is about 4.7%, which is larger than 0.13% described above, because GaAs has a lattice constant of about 5.653 Å. As a result, the first base layer arranged on the collector layer is lattice-mismatched to the collector layer to strain the crystal of the first base layer. Similarly, if GaAs is used as a material for the collector layer, a difference in lattice constant between the collector layer and the second base layer composed of InGaAs having a lattice constant of about 5.86 Å is about 3.6%, which is larger than 0.13% described above. As a result, the second base layer arranged on the collector layer with the first base layer interposed therebetween is lattice-mismatched to the collector layer to strain the crystal of the second base layer.

In this embodiment, the first base layer 18A lattice-mismatched to the collector layer 16 and the second base layer 18B lattice-matched to the collector layer 16 are contained.

Thus, the second base layer 18B does not have a critical thickness T1. As described above, in the case where the film thickness of the base layer 18 such that the sheet resistance is, for example, 200 Ω/square or less is ensured, the film thickness of the second base layer 18B may be increased while the film thickness of the first base layer 18A is less than a critical thickness T1.

Figure 8A:
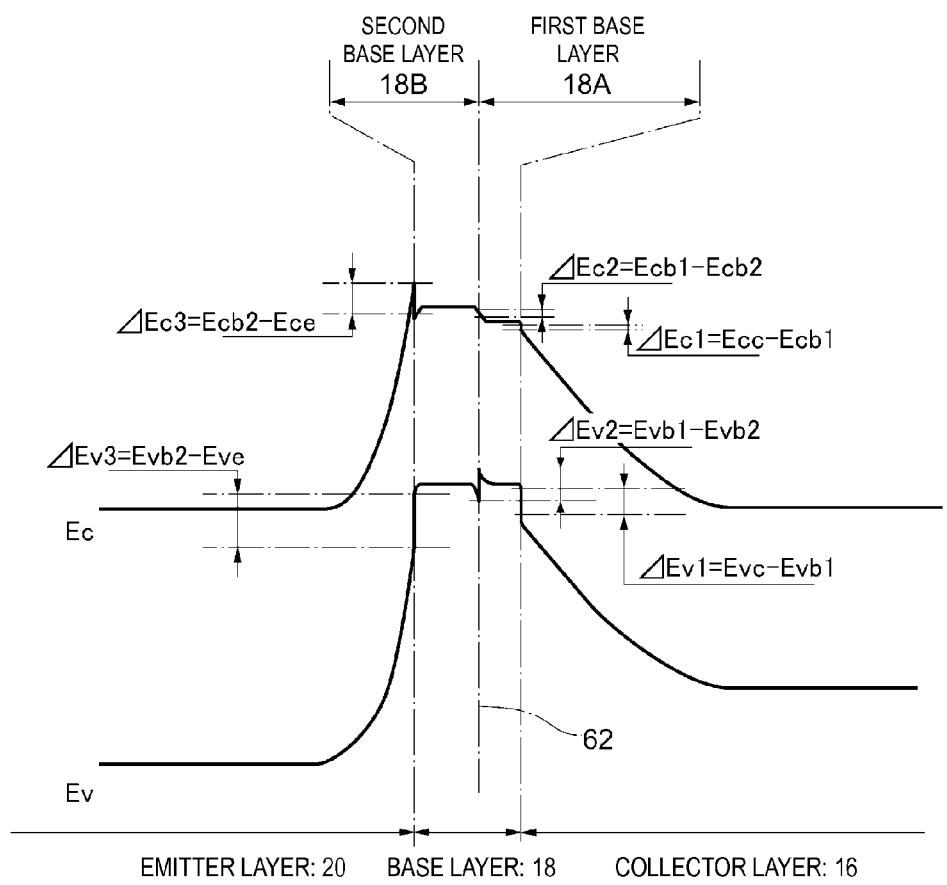
FIG. 8A is a schematic diagram of the energy band structure of the collector layer, the first base layer, the second base layer, and the emitter layer of the DHBT according to the first embodiment after the layers are joined together.
Figure 8B:
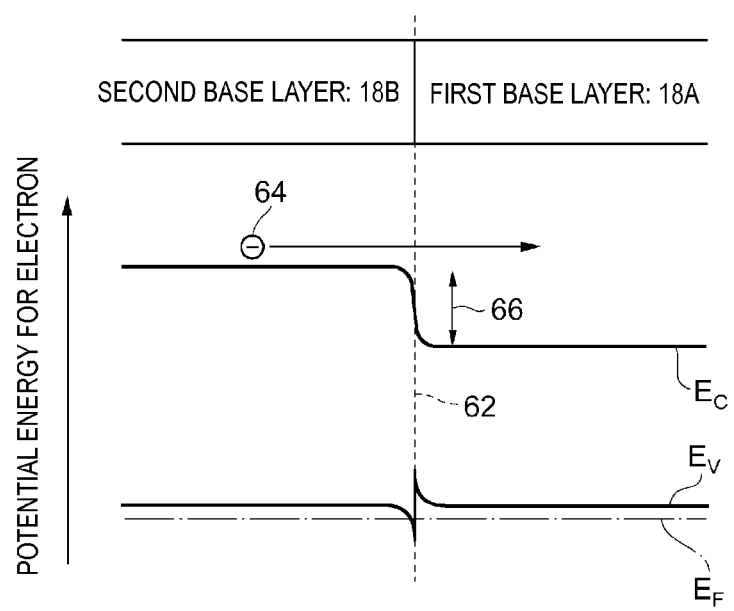
FIG. 8B is an enlarged explanatory drawing of the schematic diagram of the energy band structure of the base layers illustrated in FIG. 8A.
Figure 23:
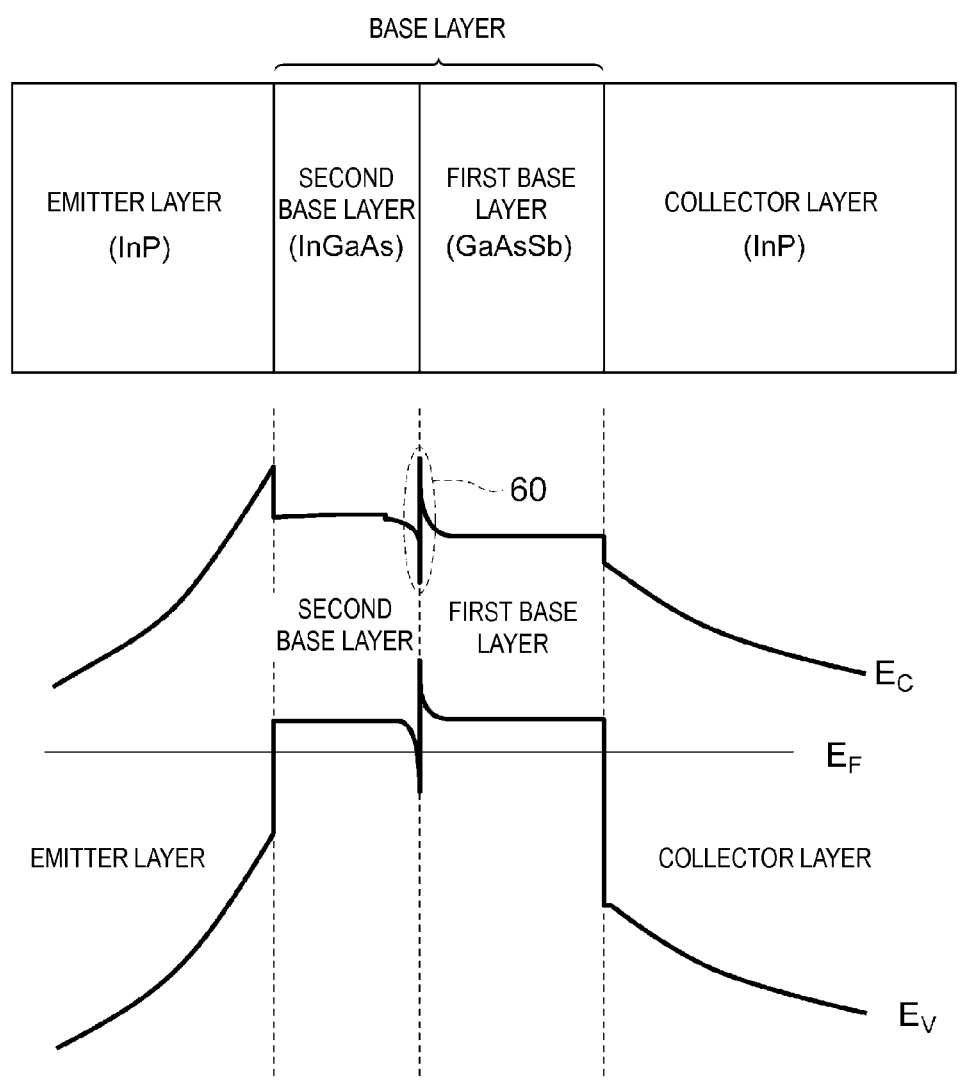
FIG. 23 is a schematic diagram of an energy band of a base layer including a first base layer composed of GaSbAs and a second base layer composed of InGaAs of a DHBT in the related art (Japanese Unexamined Patent Application Publication No. 2003-297849 described above).

Band structures of the collector layer 16, the first base layer 18A, the second base layer 18B, and the emitter layer 20 will be described below. FIG. 7 is a schematic diagram of energy band structures of the collector layer 16, the first base layer 18A, the second base layer 18B, and the emitter layer 20 of the DHBT 10A according to the embodiment in a thermal equilibrium state before the layers are joined together. FIG. 8A is a schematic diagram of the energy band structure of the collector layer 16, the first base layer 18A, the second base layer 18B, and the emitter layer 20 of the DHBT 10A according to the embodiment after the layers are joined together. FIG. 8B is an enlarged explanatory drawing of the schematic diagram of the energy band structure of the base layer 18 illustrated in FIG. 8A. FIG. 23 is a schematic diagram of an energy band of a base layer including a first base layer composed of GaSbAs and a second base layer composed of InGaAs of a DHBT in the related art (Japanese Unexamined Patent Application Publication No. 2003-297849).

Symbols in FIGS. 7 and 8 represent the following meanings.

"Ec": energy of the bottom of the conduction band in the band structure of the DHBT.

"Ev": energy of the top of the valence band in the band structure of the DHBT.

"Ecc": energy of the bottom of the conduction band of the collector layer 16.

"Ecb1": energy of the bottom of the conduction band of the first base layer 18A.

"Ecb2": energy of the bottom of the conduction band of the second base layer 18B.

"Ece": energy of the bottom of the conduction band of the emitter layer 20.

"Evc": energy of the top of the valence band of the collector layer 16.

"Evb1": energy of the top of the valence band of the first base layer 18A.

"Evb2": energy of the top of the valence band of the second base layer 18B.

"Eve": energy of the top of the valence band of the emitter layer 20.

Regarding the energy Ec of the bottom of the conduction band of an npn junction DHBT in the related art, an energy barrier 60 is present at the interface between the first base layer and the second base layer for electrons flowing from the emitter layer 20 to the base layer 18 as illustrated in FIG. 23. Although electrons flow through the energy barrier 60 by tunneling, some electrons are prevented from being transported, depending on tunneling probability, i.e., a tunneling ratio. As a result, the energy barrier 60 inhibits the electron transport.

In the DHBT 10A of the embodiment, the band structure of each layer is not particularly limited. In the case of an npn junction, as illustrated in FIG. 7, the energy Ecb2 of the bottom of the conduction band of the second base layer 18B preferably is equal to or higher than E0, which is obtained by subtracting the thermal energy (0.026 eV) of a free electron at room temperature (300 K) from the energy Ecb1 of the bottom of the conduction band of the first base layer 18A (Ecb2≥E0=Ecb1−0.026), in the thermal equilibrium state before the second base layer 18B and the first base layer 18A are joined together. The reason for this is as follows: As illustrated in FIGS. 8A and 8B, regarding the energy Ec of the bottom of the conduction band, it is possible to eliminate the energy barrier 60 to an electron 64 flowing from the emitter layer 20 to the base layer 18 at the interface 62 between the first base layer 18A and the second base layer 18B. Alternatively, it is possible to provide the energy barrier 60 such that the electron transport is not inhibited.

Figure 10A:
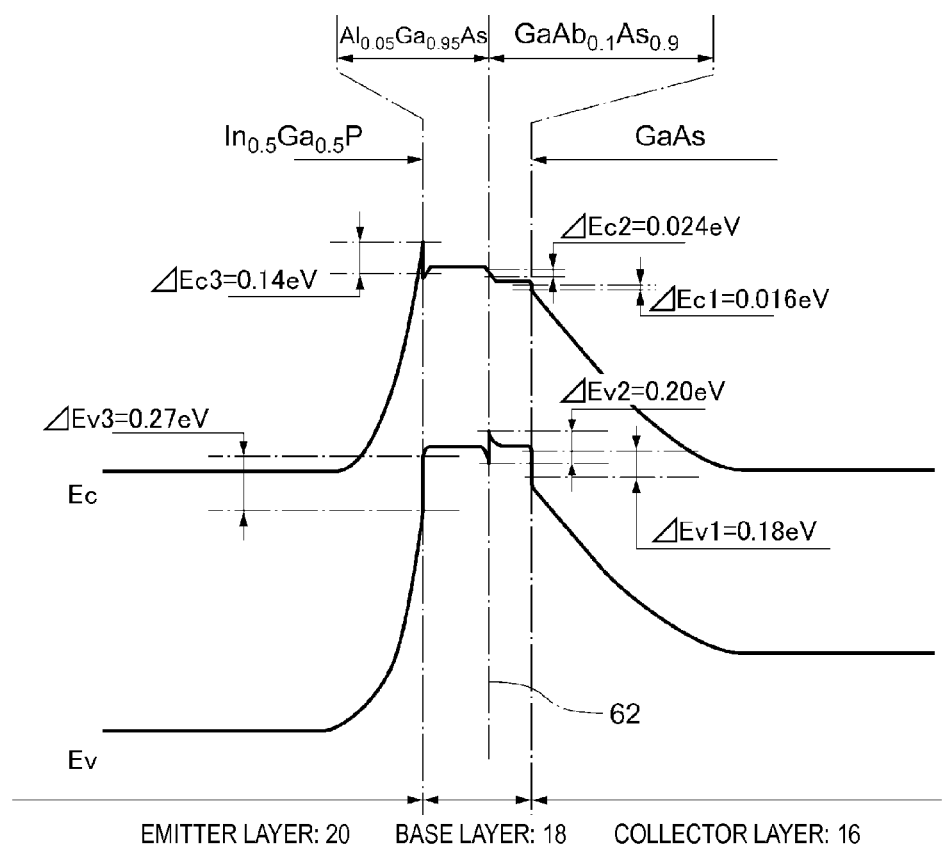
FIG. 10A is a schematic diagram of the energy band structure of the collector layer, the first base layer, the second base layer, and the emitter layer of the DHBT according to the third embodiment after the layers are joined together.
Figure 12A:
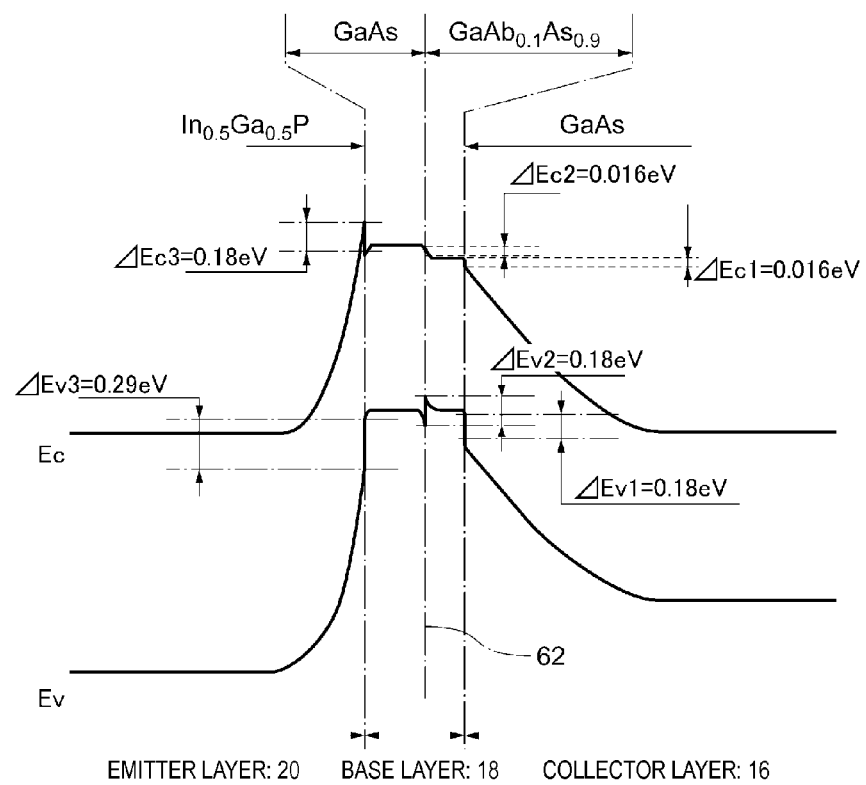
FIG. 12A is a schematic diagram of the energy band structure of the collector layer, the first base layer, the second base layer, and the emitter layer of the DHBT according to the second embodiment after the layers are joined together.
Figure 12B:
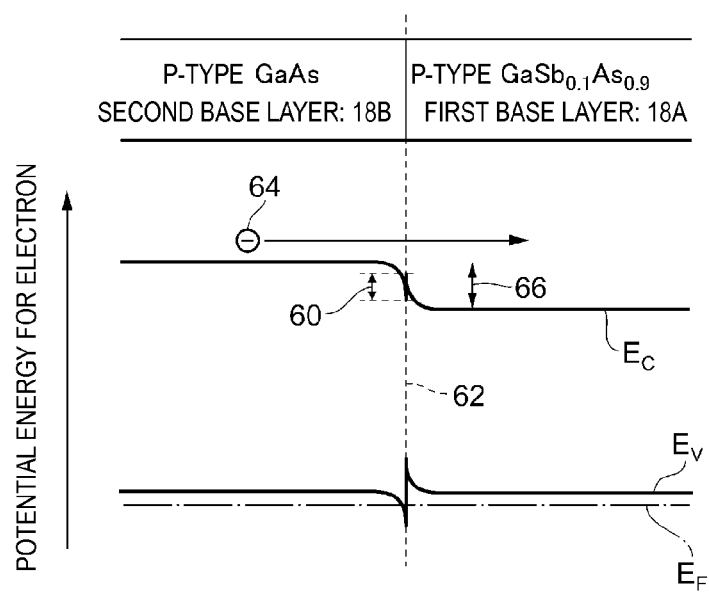
FIG. 12B is an enlarged explanatory drawing of the schematic diagram of the energy band structure of the base layers illustrated in FIG. 12A.

To eliminate the energy barrier 60, materials for the first base layer 18A and the second base layer 18B may be appropriately selected in such a manner that the energy Ecb2 of the bottom of the conduction band of the second base layer 18B represents a value equal to or higher than the energy Ecb1 of the bottom of the conduction band of the first base layer 18A. An example that satisfies the requirement will be described using another embodiment. For example, as illustrated in FIGS. 9, 10A, and 12B, $GaSb_xAs_{1-x}$ may be selected as a material (main component) for the first base layer 18A, and $Al_yGa_{1-y}As$ may be selected as a material (main component) for the second base layer 18B.

To provide the energy barrier 60 such that the electron transport is not inhibited, materials for the first base layer 18A and the second base layer 18B may be appropriately selected in such a manner that the energy Ecb2 of the bottom of the conduction band of the second base layer 18B is equal to or higher than E0, which is obtained by subtracting the thermal energy (0.026 eV) of a free electron at room temperature from the energy Ecb1 of the bottom of the conduction band of the first base layer 18A, and that the energy Ecb2 is lower than the energy Ecb1 of the bottom of the conduction band of the first base layer 18A. The reason for this is that when the energy Ecb2 of the bottom of the conduction band of the second base layer 18B is equal to or higher than E0, the electron 64 easily crosses the energy barrier owing to heat at room temperature.

An example that satisfies the requirement will be described using another embodiment. For example, as illustrated in FIGS. 11, 12A, and 12B, $GaSb_xAs_{1-x}$ may be selected as a material (main component) for the first base layer 18A, and GaAs may be selected as a material (main component) for the second base layer 18B.

As described above, in the case where the energy barrier 60 at the interface 62 is eliminated or where the energy barrier 60 such that the electron transport is not inhibited is provided, high-speed electron transport is achieved, thereby increasing the speed of the DHBT 10A.

Regarding another means for increasing the speed of the DHBT 10A and means for further increasing the speed of the DHBT 10A, as illustrated in FIG. 7, materials for the first base layer 18A and the second base layer 18B may be appropriately selected in such a manner that a value obtained by subtracting ΔEc2 from ΔEv2, i.e., ΔEv2−ΔEc2, is positive in the thermal equilibrium state before the first base layer 18A and the second base layer 18B are joined together, where ΔEv2 is obtained by subtracting the energy Evb2 of the top of the valence band of the second base layer 18B from the energy Evb1 of the top of the valence band of the first base layer 18A, and ΔEc2 is obtained by subtracting the energy Ecb2 of the bottom of the conduction band of the second base layer 18B from the energy Ecb1 of the bottom of the conduction band of the first base layer 18A.

In this case, regarding the energy Ec of the bottom of the conduction band, an energy difference 66 is present at the interface 62 between the first base layer and the second base layer as illustrated in FIG. 8B. The energy difference 66 allows an internal electric field for the electron to be generated, thereby accelerating the electron to lead to a further increase in the speed of the DHBT 10A.

In addition, an example of another means for increasing the speed of the DHBT 10A and means for further increasing the speed of the DHBT 10A is to allow a carrier concentration in the base layer 18 to exhibit a distribution in which the carrier concentration in the base layer 18 decreases in the direction in which electrons or holes flow. For example, in the case where the DHBT 10A is an npn junction transistor, it is necessary to allow the DHBT 10A to have a carrier concentration distribution in which a carrier concentration in at least one of the first base layer 18A and the second base layer 18B decreases in the electron flow direction from the emitter layer 20 side to the collector layer 16 side. For example, in the case where the DHBT 10A is a pnp junction transistor, it is necessary to allow the DHBT 10A to have a carrier concentration distribution in which a carrier concentration in at least one of the first base layer 18A and the second base layer 18B decreases in the direction from the collector layer 16 side to the emitter layer 20 side, the direction being the direction in which holes flow.

A specific distribution state of the carrier concentration will be exemplified in another embodiment.

Returning to FIG. 2, a material for the emitter layer is not particularly limited as long as it is a semiconductor. However, the emitter layer 20 forms a heterojunction with the second base layer 18B. Thus, the emitter layer 20 is preferably composed of a semiconductor mainly containing a material that is lattice-matched to the main component of the second base layer 18B. Specifically, in the case where the second base layer 18B is composed of a semiconductor containing $Al_yGa_{1-y}As$ or GaAs as a main component, the emitter layer 20 is preferably composed of a semiconductor containing InGaP or $Al_yGa_{1-y}As$ as a main component. However, the heterojunction is a premise; hence, both of the main components are not identical to each other.

Examples of a material for the base electrodes 22, the emitter electrode 26, and the collector electrodes 28 include, but are not particularly limited to, Ti/Pt/Au, WSi, and AuGe/Ni/Au.

Main Effect

In the foregoing DHBT 10A according to the first embodiment of the present disclosure, the use of GaAs as a main component of the collector layer 16 results in a reduction in the cost of the DHBT 10A. Furthermore, in the DHBT 10A, the use of the first base layer 18A having a film thickness less than the critical thickness T1 results in the inhibition of reductions in the electrical characteristics and the reliability. Thus, in the DHBT 10A, both of the reduction in cost and the inhibition of the reductions in the electrical characteristics and the reliability are achieved.

Second Embodiment

A DHBT according to a second embodiment of the present disclosure will be described below.

The DHBT according to the second embodiment of the present disclosure is a specific example of the DHBT 10A described in the first embodiment and illustrated in FIG. 2.

The DHBT 10A according to the second embodiment is an npn junction transistor including a rectangular emitter with a size of 3 μm×20 μm.

In the DHBT 10A according to the second embodiment, the substrate 12 is composed of GaAs. The subcollector layer 14 is composed of n-type GaAs (Si-doping concentration: $5 \times 10^{18}$ cm$^{-3}$, film thickness: 0.6 μm). In the second embodiment, a buffer layer (film thickness: 1 μm), not illustrated, composed of undoped GaAs is arranged between the substrate 12 and the subcollector layer 14.

The collector layer 16 is composed of n-type GaAs (Si-doping concentration: $1 \times 10^{16}$ cm$^{-3}$, film thickness: 1.0 μm). The first base layer 18A is composed of p-type $GaSb_{0.1}As_{0.9}$ (C-doping concentration: $4 \times 10^{19}$ cm$^{-3}$, film thickness: 50 nm). The second base layer 18B is composed of p-type GaAs (C-doping concentration: $4 \times 10^{19}$ cm$^{-3}$, film thickness: 100 nm). The emitter layer 20 is composed of n-type $In_{0.5}Ga_{0.5}P$ (Si concentration: $3 \times 10^{17}$ cm$^{-3}$, film thickness: 30 nm).

A contact layer 24A is formed of an n-type GaAs contact layer (Si concentration: $1 \times 10^{19}$ cm$^{-3}$, film thickness: 50 nm). A contact layer 24B is composed of n-type $InGa_{0.5}As_{0.5}$ (Si concentration: $1 \times 10^{19}$ cm$^{-3}$, film thickness: 50 nm). The collector electrodes 28 are formed of a multilayer body including AuGe (film thickness: 60 nm)/Ni (film thickness: 10 nm)/Au (film thickness: 200 nm). The base electrodes 22 are formed of a multilayer body including Ti (film thickness: 50 nm)/Pt (film thickness: 50 nm)/Au (film thickness: 200 nm).

In the DHBT 10A according to the second embodiment as described above, the collector layer 16 is composed of n-type GaAs; hence, the reduction in the cost of the DHBT 10A is achieved, compared with the collector layer composed of InP or ordered InGaP.

The first base layer 18A is composed of p-type $GaSb_{0.1}As_{0.9}$ lattice-mismatched to the GaAs of the collector layer 16. As illustrated in FIG. 6, the critical thickness T1 is expressed as: $T1 = 4.26 x^{-1.21}$ (nm). By substituting 0.1 for x, the critical thickness T1 is found to be 69.089 nm. The first base layer 18A has a film thickness of 50 nm, which is less than the critical thickness T1=69.089 nm. Thus, although the first base layer 18A is composed of p-type $GaSb_{0.1}As_{0.9}$ lattice-mismatched to the GaAs of the collector layer 16, no misfit dislocation is introduced into the crystal of the first base layer 18A, thereby resulting in the inhibition of the reductions in electrical characteristics and the reliability.

In the DHBT 10A according to the second embodiment, thus, both of the reduction in cost and the inhibition of the reductions in the electrical characteristics and the reliability are achieved. The second base layer 18B in contact with the emitter layer 20 is composed of GaAs, thereby improving variations in turn-on voltage to increase the yield, compared with materials of ternary mixed crystals (for example, AlGaAs). In the DHBT 10A according to the second embodiment, the second base layer 18B composed of p-type GaAs lattice-matched to the GaAs of the collector layer 16 has a large film thickness of 100 nm while the first base layer 18A has a film thickness equal to or smaller than the critical thickness T1. Thereby, the introduction of a misfit dislocation is inhibited, and a sheet resistance of 200 Ω/square or less, specifically, 188 Ω/square, which is desirable from the viewpoint of suppressing high-frequency noise, is achieved.

The DHBT 10A according to the second embodiment is an npn junction transistor; hence, the electron 64 flows from the emitter layer 20 side to the collector layer 16 side. Here, in the DHBT 10A according to the second embodiment, $GaSb_xAs_{1-x}$ is selected as a material for the first base layer 18A, and GaAs is selected as a material for the second base layer 18B. Thus, as illustrated in FIG. 11, the energy Ecb2 of the bottom of the conduction band of the second base layer 18B is equal to or higher than E0, which is obtained by subtracting the thermal energy (0.026 eV) of a free electron at room temperature from the energy Ecb1 of the bottom of the conduction band of the first base layer 18A, and the energy Ecb2 is lower than the energy Ecb1 of the bottom of the conduction band of the first base layer 18A.

Regarding the energy Ec of the bottom of the conduction band in the DHBT 10A according to the second embodiment, thus, the energy barrier 60 such that the electron transport is not inhibited is present at the interface 62 between the first base layer 18A and the second base layer 18B, as illustrated in FIGS. 12A and 12B. The reason for this is that the energy barrier 60 is 0.016 eV, which is lower than the thermal energy of a free electron at room temperature, and that the electron 64 flowing from the emitter layer 20 side easily crosses the energy barrier 60 owing to heat at room temperature. Thus, in the DHBT 10A according to the second embodiment, the high-speed transport of the electron 64 is achieved, thereby increasing the speed of the DHBT 10A.

In the DHBT 10A according to the second embodiment, as illustrated in FIG. 11, a value obtained by subtracting $\Delta Ec2$ (0.016 eV) from $\Delta Ev2$ (0.18 eV), i.e., $\Delta Ev2-\Delta Ec2$, is positive (0.18−0.016=0.164>0) in the thermal equilibrium state before the first base layer 18A and the second base layer 18B are joined together, where $\Delta Ev2$ is obtained by subtracting the energy $Evb2$ of the top of the valence band of the second base layer 18B from the energy $Evb1$ of the top of the valence band of the first base layer 18A, and $\Delta Ec2$ is obtained by subtracting the energy $Ecb2$ of the bottom of the conduction band of the second base layer 18B from the energy $Ecb1$ of the bottom of the conduction band of the first base layer 18A.

In this case, regarding the energy Ec of the bottom of the conduction band, the energy difference 66 (about 0.16 eV) is present at the interface 62 between the first base layer 18A and the second base layer 18B as illustrated in FIG. 12B. The energy difference 66 allows an internal electric field for the electron 64 to be generated, thereby accelerating the electron 64 to lead to a further increase in the speed of the DHBT 10A.

Third Embodiment

A DHBT according to a third embodiment of the present disclosure will be described below.

The DHBT according to the third embodiment of the present disclosure is a specific example different from the DHBT 10A according to the second embodiment as illustrated in FIG. 2 described in the first embodiment.

Components of the DHBT 10A according to the third embodiment are the same as those in the second embodiment, except for the material of the second base layer 18B.

In the DHBT 10A according to the third embodiment, the second base layer 18B is composed of p-type $Al_{0.05}Ga_{0.95}As$ (C-doping concentration: $4 \times 10^{19}$ cm$^{-3}$, film thickness: 100 nm).

In the DHBT 10A according to the third embodiment, the collector layer 16 is composed of n-type GaAs. Thus, as with the second embodiment, the reduction in the cost of the DHBT 10A is achieved. The first base layer 18A is composed of p-type $GaSb_{0.1}As_{0.9}$ lattice-mismatched to the GaAs of the collector layer 16. Thus, as with the second embodiment, the reductions in electrical characteristics and reliability are inhibited. Therefore, in the DHBT 10A according to the third embodiment, both of the reduction in cost and the inhibition of the reductions in electrical characteristics and reliability are achieved.

As with the second embodiment, in the DHBT 10A according to the third embodiment, a sheet resistance of 200 Ω/square or less, specifically, 197 Ω/square, which is desirable from the viewpoint of suppressing high-frequency noise, is achieved.

In the DHBT 10A according to the third embodiment, $GaSb_xAs_{1-x}$ is selected as a material for the first base layer 18A, and p-type $Al_{0.05}Ga_{0.95}As$ is selected as a material for the second base layer 18B. Thus, as illustrated in FIG. 9, the energy $Ecb2$ of the bottom of the conduction band of the second base layer 18B is equal to or higher than E0 and is higher than the energy $Ecb1$ of the bottom of the conduction band of the first base layer 18A.

Figure 10B:
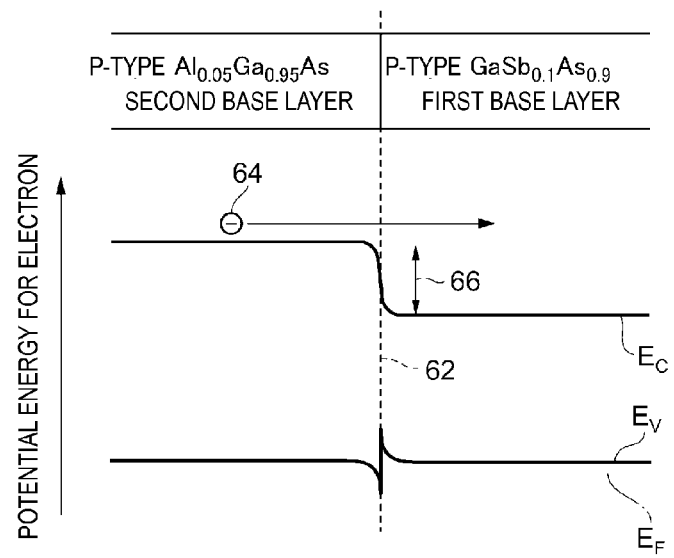
FIG. 10B is an enlarged explanatory drawing of the schematic diagram of the energy band structure of the base layers illustrated in FIG. 10A.

Thus, regarding the energy Ec of the bottom of the conduction band in the DHBT 10A according to the third embodiment, unlike the second embodiment, the energy barrier 60 is not present at the interface 62 between the first base layer 18A and the second base layer 18B, as illustrated in FIGS. 10A and 10B. Thus, in the DHBT 10A according to the third embodiment, the high-speed transport of the electron 64 flowing from the emitter layer 20 side is achieved, thereby increasing the speed of the DHBT 10A.

In the DHBT 10A according to the third embodiment, as illustrated in FIG. 9, a value obtained by subtracting $\Delta Ec2$ (−0.024 eV) from $\Delta Ev2$ (0.20 eV), i.e., $\Delta Ev2-\Delta Ec2$, is positive (0.20+0.024=0.224>0) in the thermal equilibrium state before the first base layer 18A and the second base layer 18B are joined together, where $\Delta Ev2$ is obtained by subtracting the energy $Evb2$ of the top of the valence band of the second base layer 18B from the energy $Evb1$ of the top of the valence band of the first base layer 18A, and $\Delta Ec2$ is obtained by subtracting the energy $Ecb2$ of the bottom of the conduction band of the second base layer 18B from the energy $Ecb1$ of the bottom of the conduction band of the first base layer 18A.

In this case, regarding the energy Ec of the bottom of the conduction band, the energy difference 66 (about 0.22 eV) is present at the interface 62 between the first base layer 18A and the second base layer 18B as illustrated in FIG. 10B. The energy difference 66 allows an internal electric field for the electron 64 to be generated, thereby accelerating the electron 64 to lead to a further increase in the speed of the DHBT 10A.

Fourth Embodiment

A DHBT according to a fourth embodiment will be described below.

The DHBT according to the fourth embodiment of the present disclosure is a specific example different from both the DHBTs 10A according to the second and third embodiments as illustrated in FIG. 2 described in the first embodiment.

Components of the DHBT 10A according to the fourth embodiment are the same as those in the second embodiment, except for the composition ratio of the first base layer 18A.

Figure 13A:
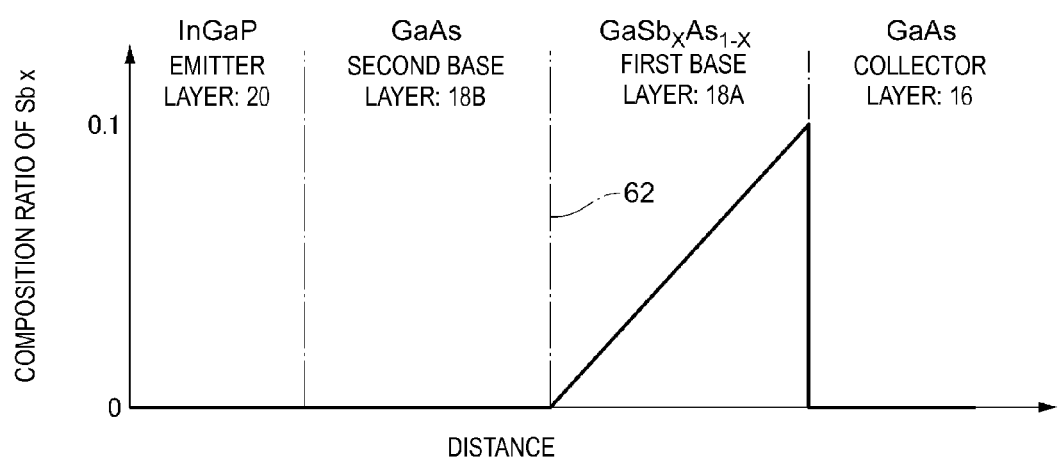
FIG. 13A is a graph illustrating a change in the composition ratio x of Sb in a collector layer, a first base layer, a second base layer, and an emitter layer of a DHBT according to a fourth embodiment, the horizontal axis representing a distance, and the vertical axis representing the composition ratio x of Sb.

The first base layer 18A according to the fourth embodiment is composed of $GaSb_xAs_{1-x}$. As illustrated in FIG. 13A, the composition ratio x of Sb in the first base layer 18A exhibits a distribution in which the composition ratio x of Sb increases in the electron flow direction from the emitter layer 20 side to the collector layer 16 side. Specifically, x is 0.1 at a position where the first base layer 18A is in contact with the collector layer 16. X is zero at a position where the first base layer 18A is in contact with the second base layer 18B. X changes linearly therebetween.

Figure 13B:
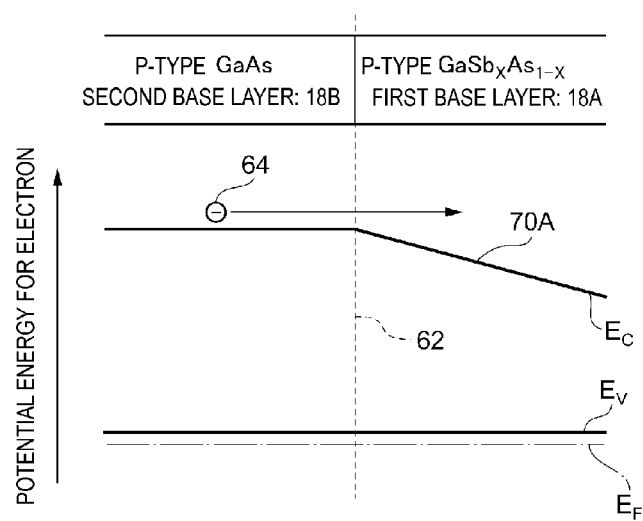
FIG. 13B is a schematic diagram of the energy band structure of the base layers of the DHBT according to the fourth embodiment.

In the DHBT 10A according to the fourth embodiment, the same effect as that in the second embodiment is provided. In addition, as illustrated in FIG. 13B, the first base layer 18A has a structure with a gradient 70A in which the energy Ec of the bottom of the conduction band decreases gradually in the direction from the emitter layer 20 side (the second base layer 18B side) to the collector layer 16 side. The gradient 70A of the energy Ec of the bottom of the conduction band acts as an internal electric field for the electron 64. Thus, the electron 64 is further accelerated in the first base layer 18A, resulting in an increase in the speed of the DHBT 10A.

Figure 14A:
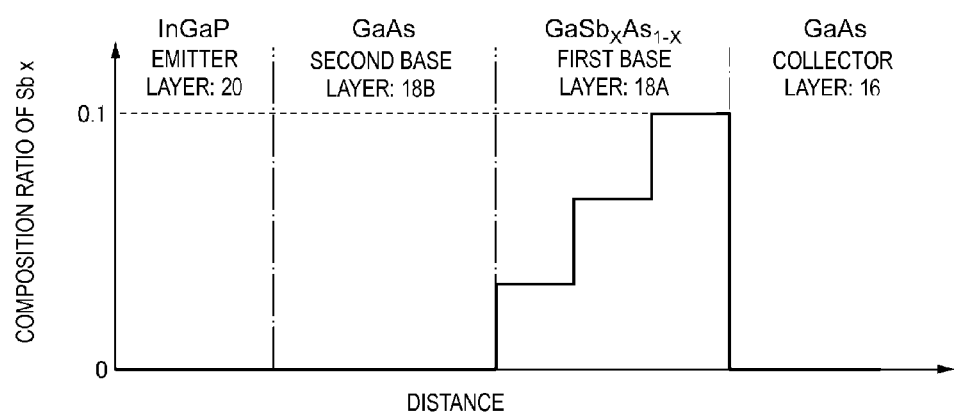
FIG. 14A is a graph illustrating an example of a change in the composition ratio x of Sb, which is different from the change in composition ratio x illustrated in FIG. 13A, in the DHBT according to the fourth embodiment.
Figure 14B:
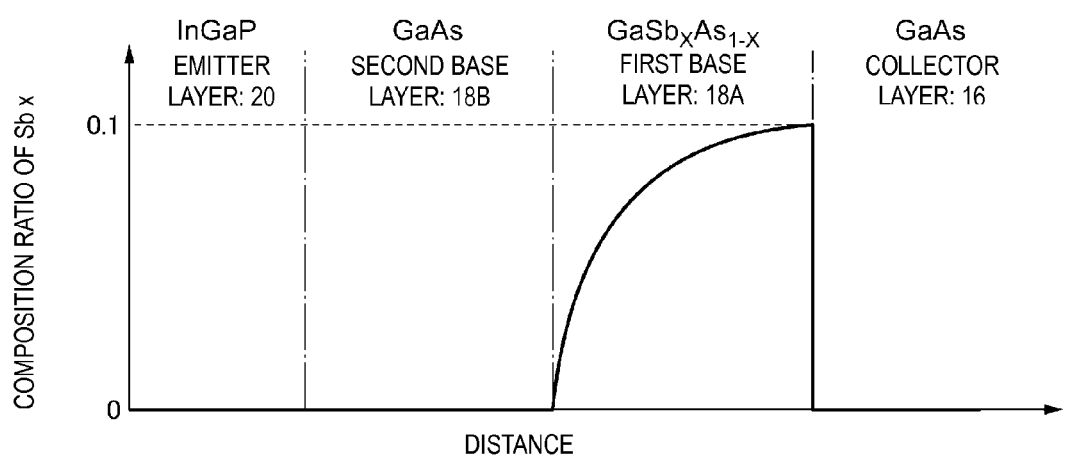
FIG. 14B is a graph illustrating another example of a change in the composition ratio x of Sb, which is different from the change in composition ratio x illustrated in FIG. 13A, in the DHBT according to the fourth embodiment.
Figure 14C:
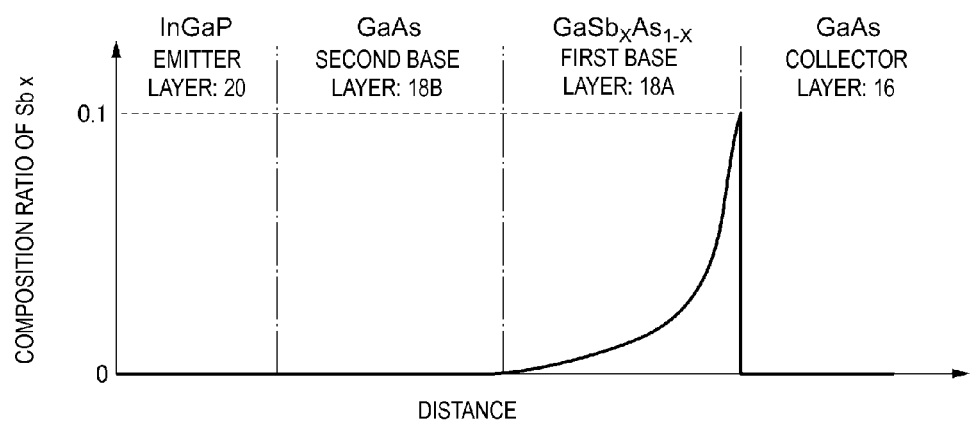
FIG. 14C is a graph illustrating still another example of a change in the composition ratio x of Sb, which is different from the change in composition ratio x illustrated in FIG. 13A, in the DHBT according to the fourth embodiment.

In the fourth embodiment, while the example in which the composition ratio x of Sb in the first base layer 18A changes linearly has been described, any form of the change in the composition ratio x may be used as long as the composition ratio x exhibits a distribution in which the composition ratio x increases in the direction from the emitter layer 20 side to the collector layer 16 side. For example, the composition ratio x may change stepwise as illustrated in FIG. 14A. In addition, the composition ratio x may change in a curved fashion, such as an arc-like shape, as illustrated in FIG. 14B. Furthermore, the composition ratio x may change in a curved fashion, such as a quadratic function, as illustrated in FIG. 14C.

While the case where x is 0.1 at the position where the first base layer 18A is in contact with the collector layer 16 and x is zero at the position where the first base layer 18A is in contact with the second base layer 18B has been described above, the value of x is not limited thereto.

Fifth Embodiment

A DHBT according to a fifth embodiment will be described below.

The DHBT according to the fifth embodiment of the present disclosure is a specific example different from both the DHBTs 10A according to the second and third embodiments as illustrated in FIG. 2 described in the first embodiment.

Components of the DHBT 10A according to the fifth embodiment are the same as those in the second embodiment, except for the C-doping concentration (carrier concentration) in the first base layer 18A and the second base layer 18B.

Figure 15A:
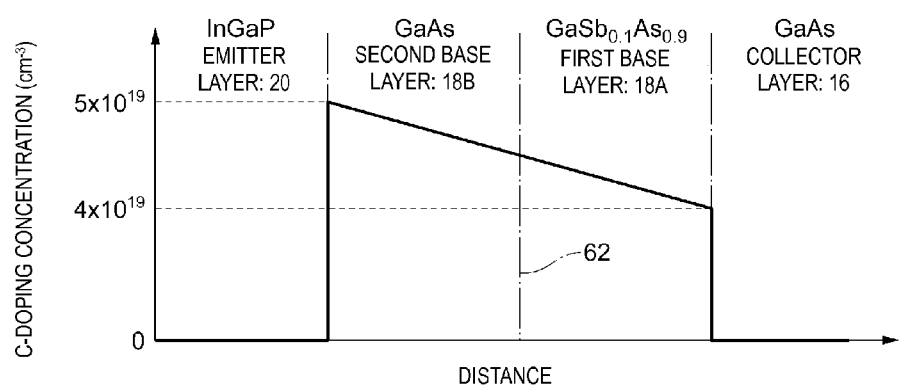
FIG. 15A is a graph illustrating a change in C-doping concentration in a collector layer, a first base layer, a second base layer, and an emitter layer of a DHBT according to a fifth embodiment, the horizontal axis representing a distance, and the vertical axis representing the C-doping concentration.

In the first base layer 18A and the second base layer 18B according to the fifth embodiment, as illustrated in FIG. 15A, the C-doping concentration exhibits a distribution in which the C-doping concentration decreases in the electron flow direction from the emitter layer 20 side to the collector layer 16 side. Specifically, the C-doping concentration is $4 \times 10^{19}$ $cm^{-3}$ at the position where the first base layer 18A is in contact with the collector layer 16. The C-doping concentration is $5 \times 10^{19}$ $cm^{-3}$ at the position where the second base layer 18B is in contact with the emitter layer 20. The C-doping concentration changes linearly therebetween.

Figure 15B:
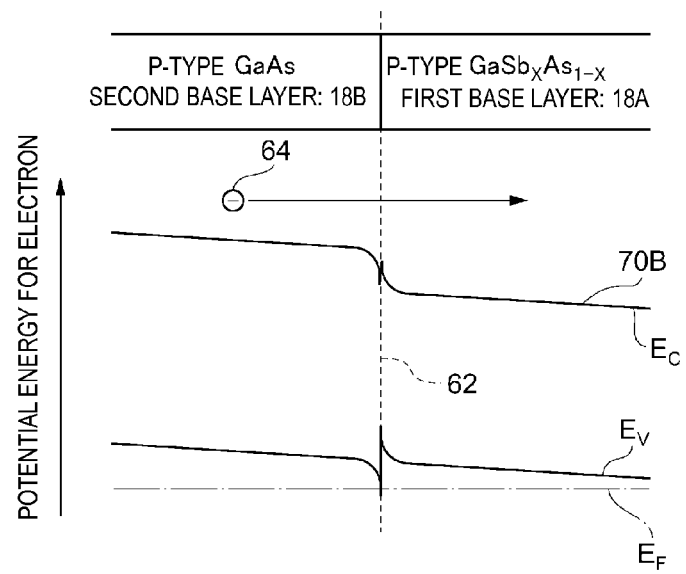
FIG. 15B is a schematic diagram of the energy band structure of the base layers of the DHBT according to the fifth embodiment.

In the DHBT 10A according to the fifth embodiment, the same effect as that in the second embodiment is provided. In addition, as illustrated in FIG. 15B, each of the first base layer 18A and the second base layer 18B has a structure with a gradient 70B in which the energy Ec of the bottom of the conduction band decreases gradually in the direction from the emitter layer 20 side to the collector layer 16 side. The gradient 70B of the energy Ec of the bottom of the conduction band acts as an internal electric field for the electron 64. Thus, the electron 64 is further accelerated in the second base layer 18B and the first base layer 18A, resulting in an increase in the speed of the DHBT 10A.

Figure 16A:
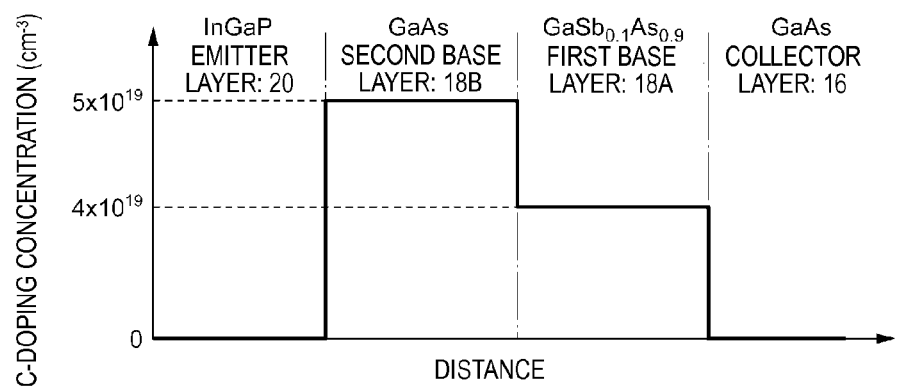
FIG. 16A is a graph illustrating an example of a change in C-doping concentration, which is different from the change in C-doping concentration illustrated in FIG. 15A, in the DHBT according to the fifth embodiment.
Figure 16B:
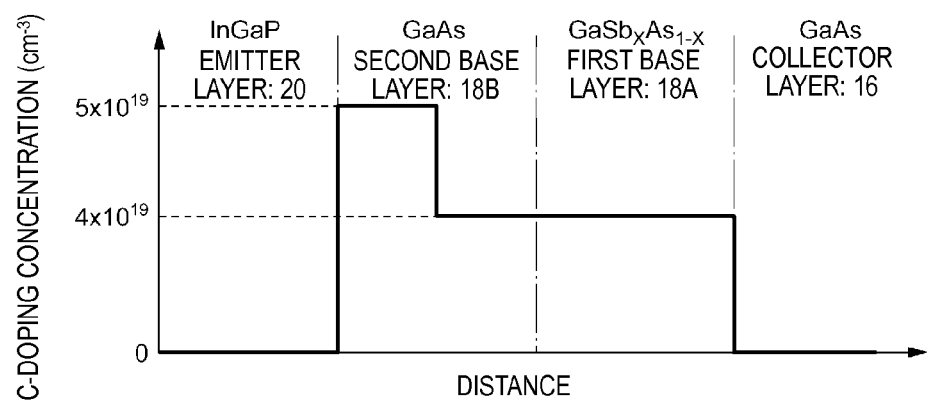
FIG. 16B is a graph illustrating another example of the change in C-doping concentration, which is different from the change in C-doping concentration illustrated in FIG. 15A, in the DHBT according to the fifth embodiment.
Figure 16C:
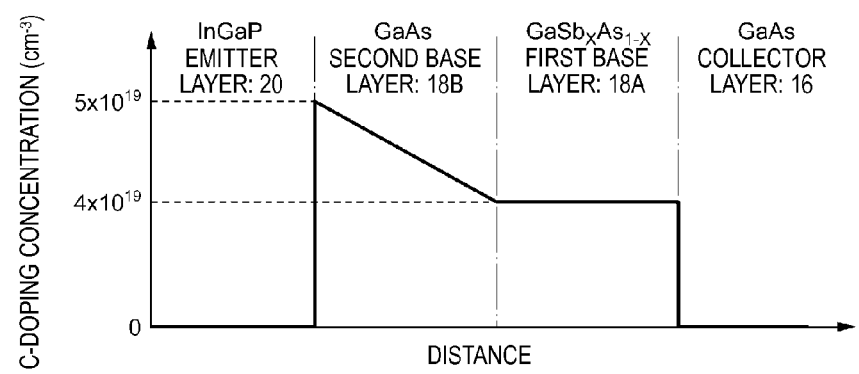
FIG. 16C is a graph illustrating still another example of a change in C-doping concentration, which is different from the change in C-doping concentration illustrated in FIG. 15A, in the DHBT according to the fifth embodiment.
Figure 16D:
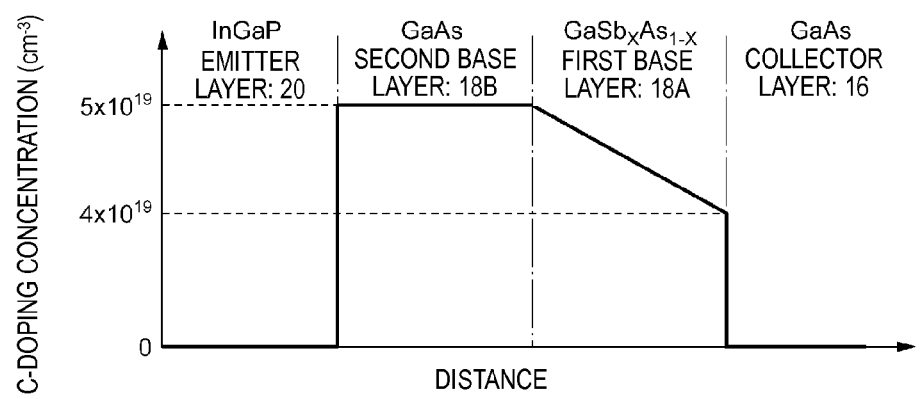
FIG. 16D is a graph illustrating yet another example of a change in C-doping concentration, which is different from the change in C-doping concentration illustrated in FIG. 15A, in the DHBT according to the fifth embodiment.

In the fifth embodiment, while the example in which the C-doping concentration in each of the first base layer 18A and the second base layer 18B changes linearly has been described, any form of the change in the C-doping concentration may be used as long as the C-doping concentration exhibits a distribution in which the C-doping concentration decreases in the direction from the emitter layer 20 side to the collector layer 16 side. For example, as illustrated in FIG. 16A, the C-doping concentration may be constant in each of the first base layer 18A and the second base layer 18B and may change stepwise at the interface between the first base layer 18A and the second base layer 18B. As illustrated in FIG. 16B, the C-doping concentration may be constant in the first base layer 18A and may change stepwise in the second base layer 18B. As illustrated in FIG. 16C, the C-doping concentration may be constant in the first base layer 18A and may have a gradient in the second base layer 18B. As illustrated in FIG. 16D, the C-doping concentration may be constant in the second base layer 18B and may have a gradient in the first base layer 18A.

While the case where the C-doping concentration is $4 \times 10^{19}$ $cm^{-3}$ at the position where the first base layer 18A is in contact with the collector layer 16 and the C-doping concentration is $5 \times 10^{19}$ $cm^{-3}$ at the position where the second base layer 18B is in contact with the emitter layer 20 has been described, the value of the C-doping concentration is not limited thereto.

Sixth Embodiment

A DHBT according to a sixth embodiment will be described below.

The sixth embodiment differs from the second embodiment in that the DHBTs 10A (unit HBTs) described in the second embodiment are connected in parallel.

Figure 17A:
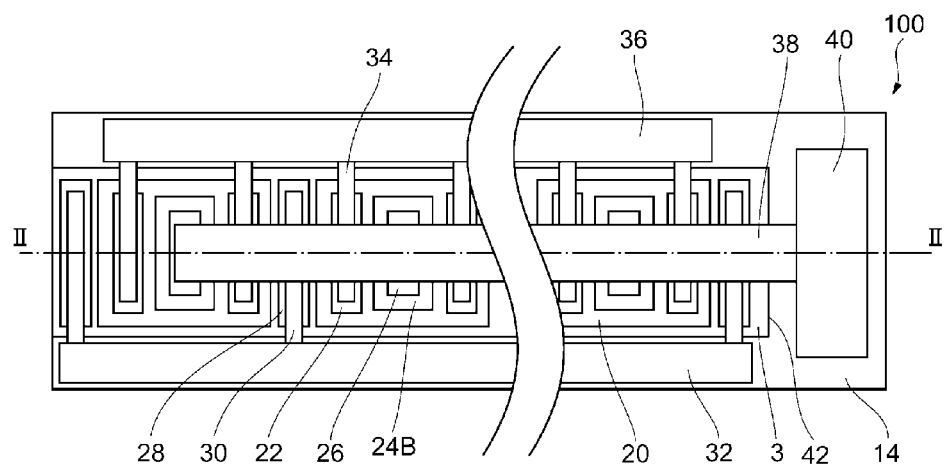
FIG. 17A is a plan view of a DHBT according to a sixth embodiment of the present disclosure.
Figure 17B:
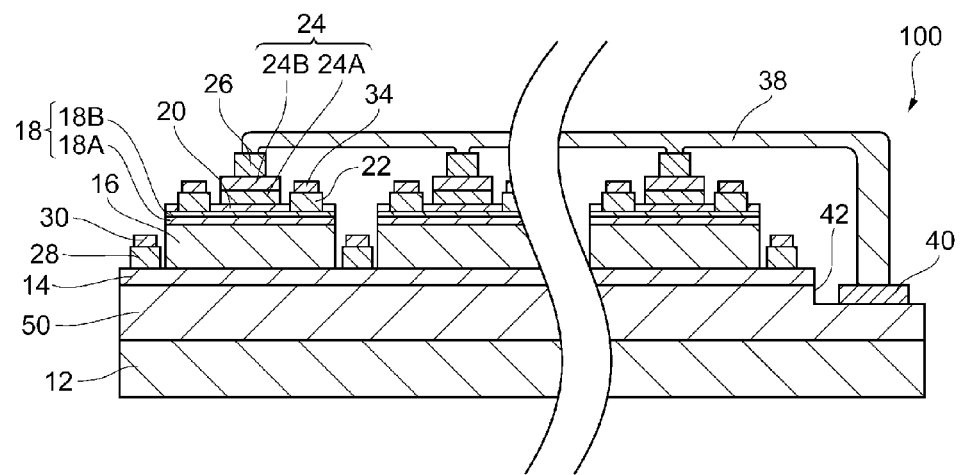
FIG. 17B is a cross-sectional view taken along line II-II in FIG. 17A.

FIG. 17A is a plan view of a DHBT 100 according to the sixth embodiment of the present disclosure. FIG. 17B is a cross-sectional view taken along line II-II in FIG. 17A.

In the DHBT 100 in which the unit HBTs are connected in parallel, the same effect as that in the second embodiment is provided. In addition, a large amount of power can be handled. Regarding the DHBTs 10A described in the third to fifth embodiments, by connecting the DHBTs 10A in parallel, a large amount of power can also be handled.

Seventh Embodiment

A DHBT according to a seventh embodiment will be described below.

In the seventh embodiment, a method for producing the DHBT 100 described in the sixth embodiment will be described with reference to FIGS. 18 and 19.

Figure 18A:
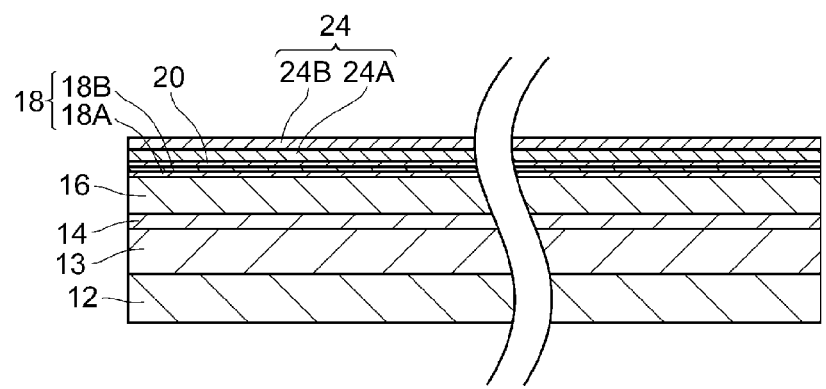
FIG. 18A illustrates the production process of the DHBT described in the sixth embodiment.

As illustrated in FIG. 18A, the buffer layer 50 (film thickness: 1 µm) composed of undoped GaAs and the subcollector layer 14 (Si-doping concentration: $5 \times 10^{18}$ $cm^{-3}$, film thickness: 0.6 µm) composed of n-type GaAs are stacked on the substrate 12 composed of semi-insulating GaAs by an organometallic vapor phase epitaxy method.

Next, the collector layer 16 (Si-doping concentration: $5 \times 10^{16}$ $cm^{-3}$, film thickness: 1.0 µm) composed of n-type GaAs, the first base layer 18A (C-doping concentration: $4 \times 10^{19}$ $cm^{-3}$, film thickness: 50 nm) composed of p-type $GaSb_{0.1}As_{0.9}$, the second base layer 18B (C-doping concentration: $4 \times 10^{19}$ $cm^{-3}$, film thickness: 100 nm) composed of p-type GaAs, and the emitter layer 20 (Si concentration: $3 \times 10^{17}$ $cm^{-3}$, film thickness: 30 nm) composed of n-type $In_{0.5}Ga_{0.5}P$ are stacked on the subcollector layer 14 by the organometallic vapor phase epitaxy method.

Subsequently, the contact layer 24A (Si-doping concentration: $1 \times 10^{19}$ $cm^{-3}$, film thickness: 50 nm) composed of n-type GaAs and the contact layer 24B (Si-doping concentration: $1 \times 10^{16}$ $cm^{-3}$, film thickness: 50 nm) composed of n-type $In_{0.5}Ga_{0.5}As$ are stacked on the emitter layer 20 by the organometallic vapor phase epitaxy method.

Figure 18B:
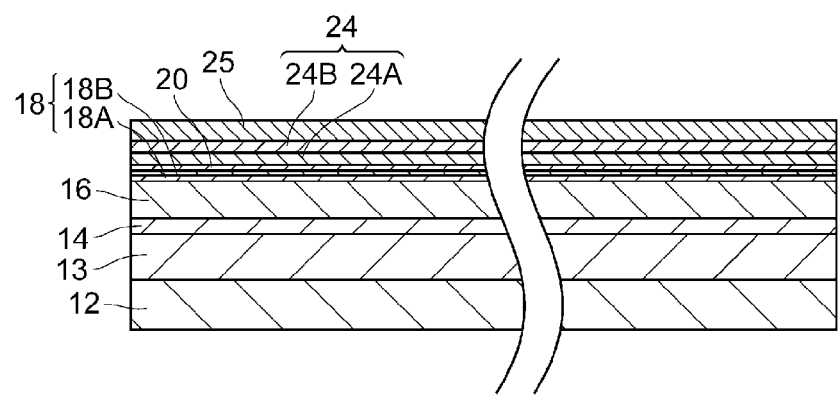
FIG. 18B illustrates the production process of the DHBT described in the sixth embodiment subsequent to FIG. 18A.

As illustrated in FIG. 18B, a $W_{0.7}Si_{0.3}$ layer 25 (film thickness: 0.3 µm) is deposited on the entire surface of the wafer by a radio-frequency sputtering method.

Figure 18C:
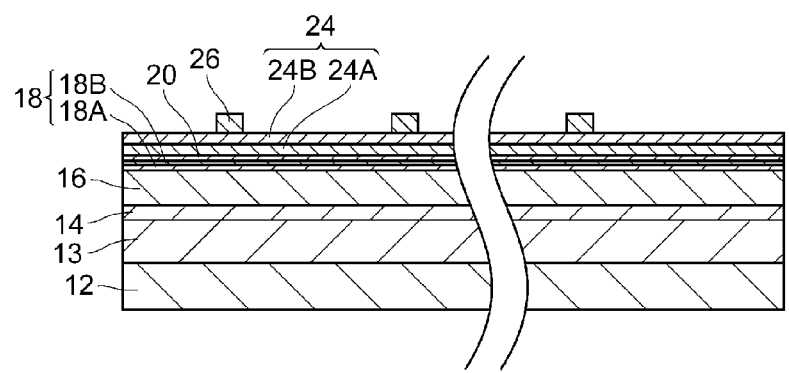
FIG. 18C illustrates the production process of the DHBT described in the sixth embodiment subsequent to FIG. 18B.

As illustrated in FIG. 18C, the $W_{0.7}Si_{0.3}$ layer 25 is processed by photolithography and dry etching with $CF_4$ to form the emitter electrodes 26.

Figure 18D:
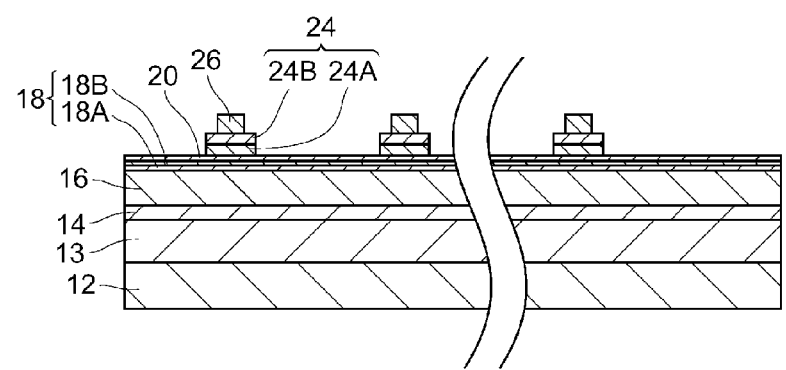
FIG. 18D illustrates the production process of the DHBT described in the sixth embodiment subsequent to FIG. 18C.

As illustrated in FIG. 18D, the contact layer 24B and the contact layer 24A are processed to a desired shape to form emitter regions.

Here, an example of a method for forming the emitter regions is as follows: unnecessary regions of the contact layer 24B and the contact layer 24A composed of n-type GaAs are removed by photolithography and wet etching with an etching solution (example of the composition of the etching solution:phosphoric acid:aqueous hydrogen peroxide:water=1:2:40).

Figure 19A:
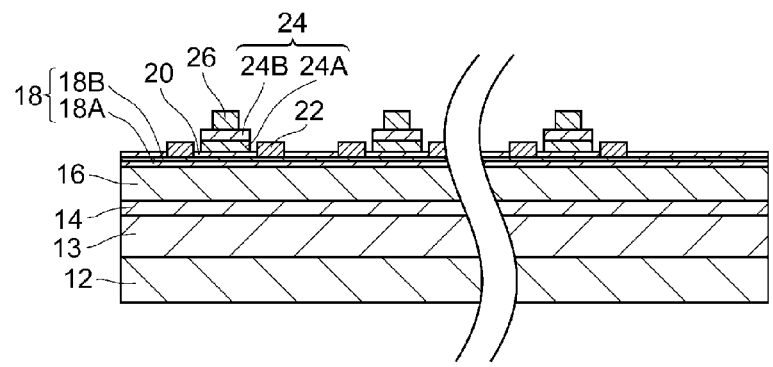
FIG. 19A illustrates the production process of the DHBT described in the sixth embodiment subsequent to FIG. 18D.

As illustrated in FIG. 19A, the base electrodes 22 are formed by evaporation and a lift-off method, each of the base electrodes 22 passing through the emitter layer 20 and being formed of Ti (film thickness: 50 nm)/Pt (film thickness: 50 nm)/Au (film thickness: 200 nm) at least on the second base layer 18B.

Figure 19B:
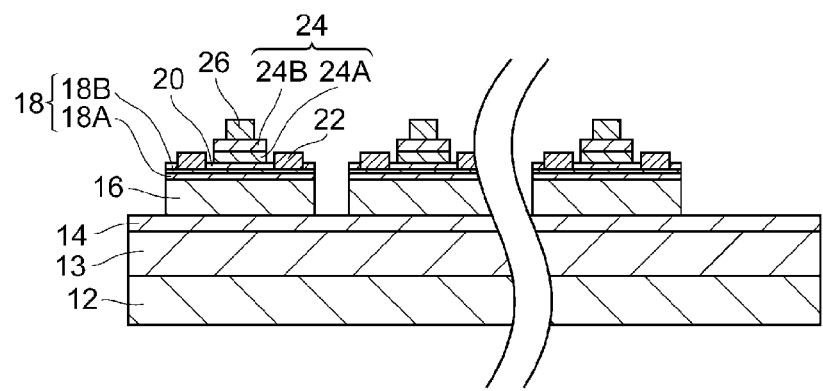
FIG. 19B illustrates the production process of the DHBT described in the sixth embodiment subsequent to FIG. 19A.

As illustrated in FIG. 19B, unnecessary regions of the emitter layer 20, the second base layer 18B, the first base layer 18A, and the collector layer 16 are removed by photolithography and wet etching to expose the subcollector layer 14, thereby forming base regions.

Etching solutions used here are as follows: Hydrochloric acid is used as an etching solution for the etching of the emitter layer 20. An example of the composition of an etching solution for the etching of the second base layer 18B, the first base layer 18A, and the collector layer 16 is phosphoric acid:aqueous hydrogen peroxide:water=1:2:40.

Figure 19C:
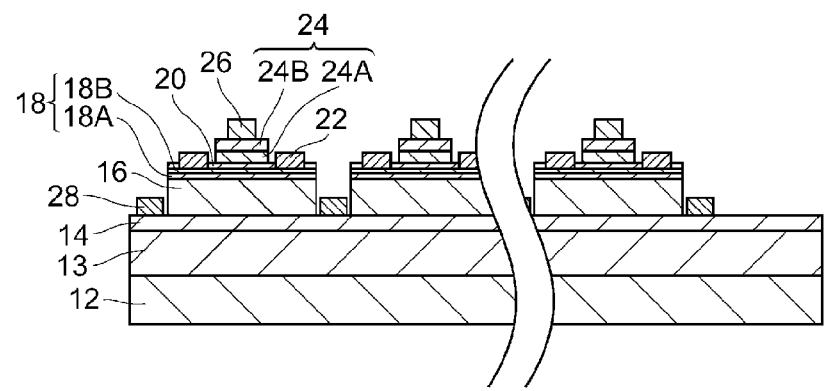
FIG. 19C illustrates the production process of the DHBT described in the sixth embodiment subsequent to FIG. 19B.

As illustrated in FIG. 19C, the collector electrodes are formed by evaporation and the lift-off method and subjected to alloying at 350° C. for 30 minutes. Each of the collector electrodes 28 is formed of a multilayer body including AuGe (film thickness: 60 nm)/Ni (film thickness: 10 nm)/Au (film thickness: 200 nm).

Figure 19D:
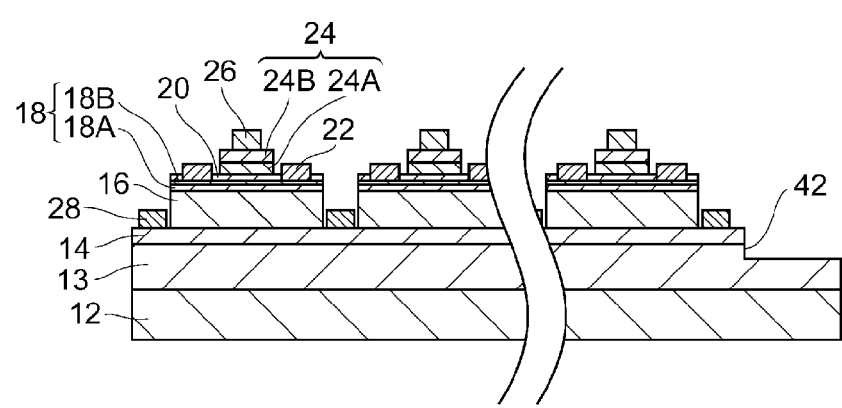
FIG. 19D illustrates the production process of the DHBT described in the sixth embodiment subsequent to FIG. 19C.

As illustrated in FIG. 19D, the isolation trench 42 is formed by wet etching. An example of the composition of an etching solution is phosphoric acid:aqueous hydrogen peroxide:water=1:2:40.

As illustrated in FIG. 17B, interconnections which connect the emitter electrodes 26 together, which connect the base electrodes 22 together, and which connect the collector electrodes 28 together are formed among the unit HBTs.

The DHBT 100 illustrated in FIGS. 17A and 17B is produced through the foregoing steps. In the resulting DHBT 100, the same effect as that of the sixth embodiment is provided. In the seventh embodiment, while the method for producing the DHBT 100 has been described, it is possible to produce the DHBTs 10A according to the first to fifth embodiments by existing techniques in addition to the techniques described in the seventh embodiment.

Eighth Embodiment

An eighth embodiment of the present disclosure will be described below.

In the eighth embodiment, a power amplifier including the DHBT 10A according to the second embodiment will be described.

Figure 20:
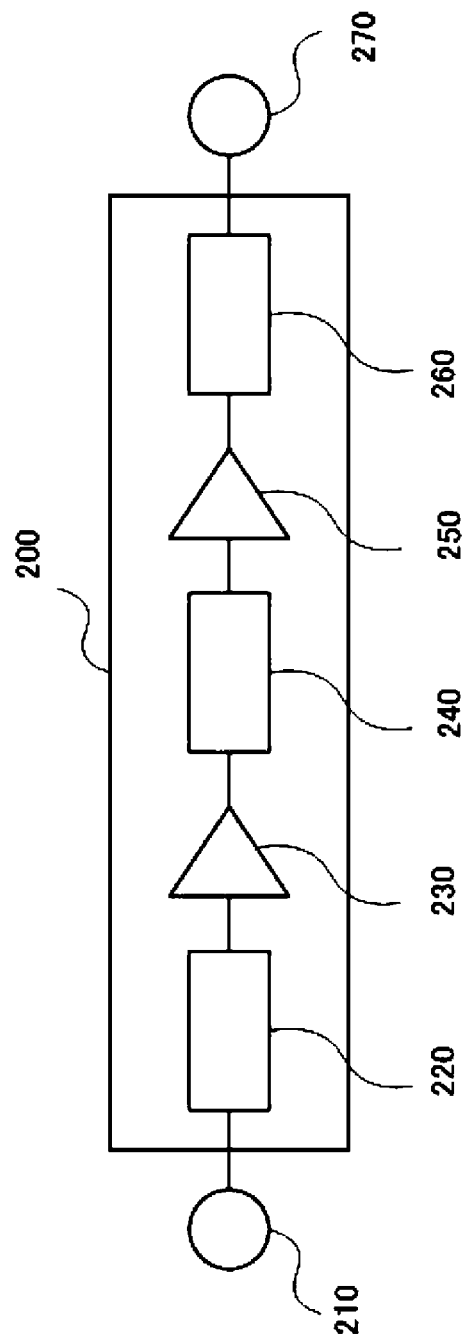
FIG. 20 is a block diagram of a power amplifier according to an eighth embodiment.

FIG. 20 is a block diagram of a power amplifier 200. As illustrated in FIG. 20, the power amplifier 200 includes a high-frequency input terminal 210 that is a terminal for inputting a high frequency, an input matching circuit 220 configured to perform the matching of input from the high-frequency input terminal 210, a first amplifier circuit 230 configured to amplify output from the input matching circuit 220, an interstage matching circuit 240 configured to perform the matching of output from the first amplifier circuit 230, a second amplifier circuit 250 configured to amplify output from the interstage matching circuit 240, an output matching circuit 260 configured to perform the matching of output from the second amplifier circuit 250, and a high-frequency output terminal 270 configured to allow output from the output matching circuit 260 to be output as a high frequency.

Figure 21:
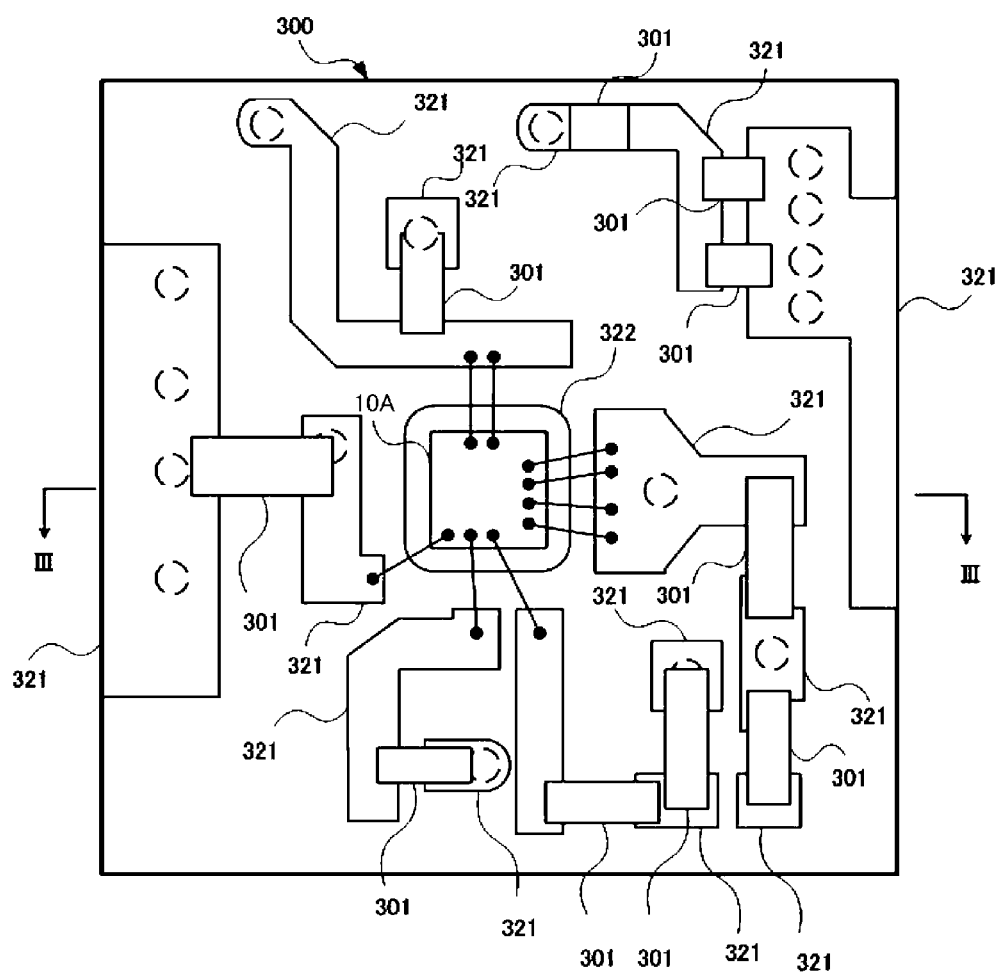
FIG. 21 is a plan view illustrating a mounting configuration of a power amplifier module including the power amplifier according to the eighth embodiment.
Figure 22:
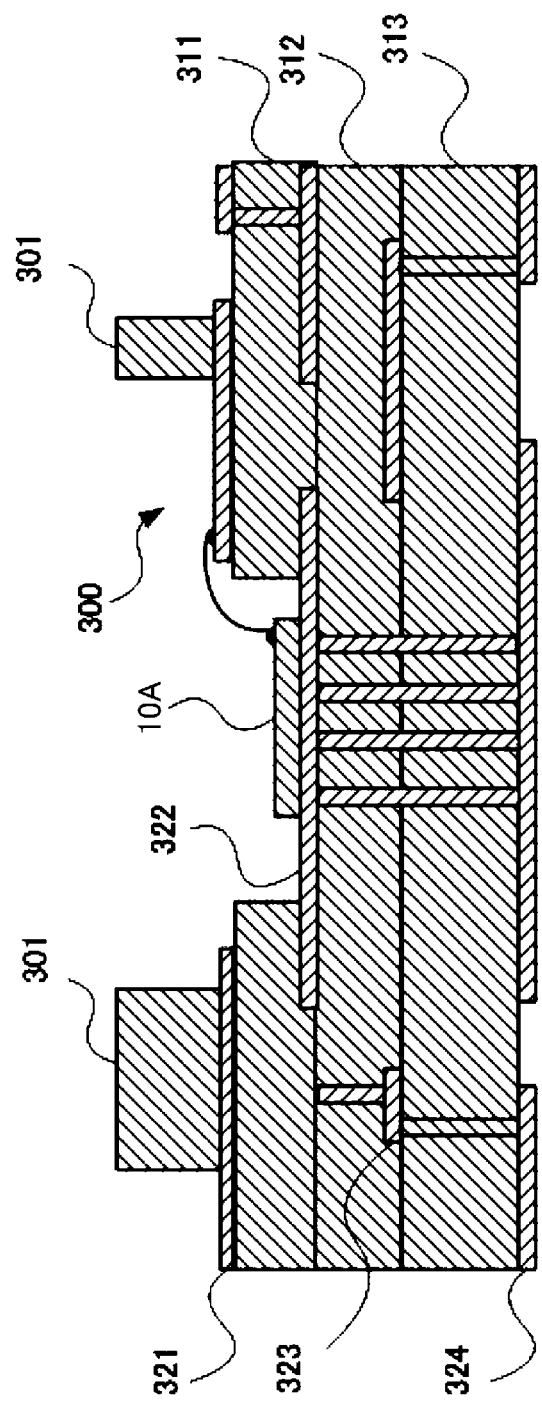
FIG. 22 is a cross-sectional view taken along line III-III in FIG. 21.

FIG. 21 is a plan view illustrating a mounting configuration of a power amplifier module 300 including the power amplifier 200. FIG. 22 is a cross-sectional view taken along line III-III in FIG. 21.

As illustrated in FIG. 22, in the power amplifier module 300, three mounting boards 311 to 313 and four conductor layers 321 to 324 are alternately stacked, and the DHBT 10A is connected to the conductor layer 322. As illustrated in FIG. 21, the DHBT 10A connected to the conductor layer 322 of the power amplifier module 300 is connected to the adjacent conductor layers 321 through interconnections. A plurality of passive elements 301 are arranged so as to connect predetermined conductor layers 321 together.

As described above, the power amplifier 200 according to the eighth embodiment includes the DHBT 10A. Thus, the power amplifier module that achieves both of a reduction in cost and the inhibition of reductions in electrical characteristics and reliability is provided.

In the eighth embodiment, while the case where the DHBT 10A described in the second embodiment is mounted on the power amplifier 200 has been described, the power amplifier 200 is not limited thereto. Similarly, the DHBTs 10A and the DHBT 100 described in the third to sixth embodiments may be mounted.

The foregoing first to eighth embodiments are intended to facilitate the understanding of the present disclosure and are not intended to be construed as limiting the present disclosure. Changes and modifications may be made without departing from the scope of the present disclosure. The present disclosure also includes equivalents thereof.

The invention claimed is:

1. A heterojunction bipolar transistor comprising:
a collector layer composed of a semiconductor containing GaAs as a main component;
a first base layer that forms a heterojunction with the collector layer, the first base layer being composed of a semiconductor containing a material as a main component, the material being lattice-mismatched to the main component of the collector layer, and the first base layer having a film thickness less than a critical thickness at which a misfit dislocation is introduced;
a second base layer joined to the first base layer, the second base layer being composed of a semiconductor containing a material as a main component, the material being lattice-matched to the main component of the collector layer;
an emitter layer that forms a heterojunction with the second base layer, and
in a state before the first base layer and the second base layer are joined together, the energy of the bottom of the conduction band of the second base layer is equal to or higher than a value obtained by subtracting the thermal energy of a free electron at room temperature from the energy of the bottom of the conduction band of the first base layer.

2. The heterojunction bipolar transistor according to claim 1, wherein the collector layer is composed of an n-type semiconductor containing the GaAs, each of the first base layer and the second base layer is composed of a p-type semiconductor containing a corresponding one of the main components, the emitter layer is composed of an n-type semiconductor.

3. The heterojunction bipolar transistor according to claim 2, wherein in the state before the first base layer and the second base layer are joined together, a first value obtained by subtracting a second value from a third value is positive, where the second value is obtained by subtracting the energy of the bottom of the conduction band of the second base layer from the energy of the bottom of the conduction band of the first base layer, and the third value is obtained by subtracting the energy of the top of the valence band of the second base layer from the energy of the top of the valence band of the first base layer.

4. The heterojunction bipolar transistor according to claim 2, wherein a carrier concentration in at least one of the first base layer and the second base layer exhibits a distribution in which the carrier concentration decreases in a direction from the emitter layer side to the collector layer side.

5. The heterojunction bipolar transistor according to claim 1, wherein the main component of the first base layer is $GaSb_xAs_{1-x}$ (x: composition ratio of Sb, x>0).

6. The heterojunction bipolar transistor according to claim 5, wherein a composition ratio of Sb in the first base layer exhibits a distribution in which the composition of Sb increases in a direction from the emitter layer side to the collector layer side.

7. The heterojunction bipolar transistor according to claim 1, wherein the main component of the second base layer is GaAs or $Al_yGa_{1-y}As$ (y: composition ratio of Al, y>0).

8. The heterojunction bipolar transistor according to claim 7, wherein the emitter layer is composed of a semiconductor containing $Al_yGa_{1-y}As$ or InGaP as a main component.

9. The heterojunction bipolar transistor according to claim 1, wherein the main component of the second base layer is GaAs.

10. The heterojunction bipolar transistor according to claim 1, wherein the first base layer and the second base layer have a thickness such that the base layer has a sheet resistance of 200 W/square or less.

11. The heterojunction bipolar transistor according to claim 1, further comprising:
a semiconductor substrate that lies on a side of the collector layer opposite the side on which the first base layer and the second base layer lie, the semiconductor substrate being composed of GaAs or Si as a main component.

12. A power amplifier module comprising the heterojunction bipolar transistor according to claim 1.

* * * * *